(12) United States Patent
Kirkpatrick et al.

(10) Patent No.: US 11,093,324 B2
(45) Date of Patent: *Aug. 17, 2021

(54) DYNAMIC DATA VERIFICATION AND RECOVERY IN A STORAGE SYSTEM

(71) Applicant: PURE STORAGE, INC., Mountain View, CA (US)

(72) Inventors: Peter E. Kirkpatrick, Mountain View, CA (US); Ronald Karr, Palo Alto, CA (US)

(73) Assignee: Pure Storage, Inc., Mountain View, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/553,387

(22) Filed: Aug. 28, 2019

(65) Prior Publication Data

US 2019/0391872 A1    Dec. 26, 2019

Related U.S. Application Data

(63) Continuation of application No. 15/665,128, filed on Jul. 31, 2017, now Pat. No. 10,402,266.

(51) Int. Cl.
*G06F 11/10* (2006.01)
*G11C 29/52* (2006.01)

(52) U.S. Cl.
CPC .......... *G06F 11/1068* (2013.01); *G11C 29/52* (2013.01)

(58) Field of Classification Search
CPC .................................................. G06F 11/1068
USPC ................................ 714/766, 764, 769, 765
See application file for complete search history.

(56) References Cited

U.S. PATENT DOCUMENTS

| 5,208,813 | A | 5/1993 | Stallmo |
| 5,403,639 | A | 4/1995 | Belsan |
| 5,940,838 | A | 8/1999 | Schmuck et al. |
| 6,263,350 | B1 | 7/2001 | Wollrath et al. |
| 6,412,045 | B1 | 6/2002 | DeKoning et al. |
| 6,718,448 | B1 | 4/2004 | Ofer |
| 6,757,769 | B1 | 6/2004 | Ofer |
| 6,799,283 | B1 | 9/2004 | Tamai et al. |
| 6,834,298 | B1 | 12/2004 | Singer et al. |
| 6,850,938 | B1 | 2/2005 | Sadjadi |
| 6,915,434 | B1 | 7/2005 | Kuroda |
| 6,973,549 | B1 | 12/2005 | Testardi |

(Continued)

FOREIGN PATENT DOCUMENTS

| CN | 103370685 A | 10/2013 |
| CN | 103370686 A | 10/2013 |

(Continued)

OTHER PUBLICATIONS

Microsoft Corporation, "GCSettings.IsServerGC Property", Retrieved Oct. 27, 2013 via the WayBack Machine, 3 pages.

(Continued)

*Primary Examiner* — Fritz Alphonse
(74) *Attorney, Agent, or Firm* — Womble Bond Dickinson (US) LLP

(57) ABSTRACT

In one implementation, a method comprises storing verification data and erasure codes separately in a plurality of storage devices. The method further comprises determining, by a processing device, whether data to be written to the plurality of storage devices is lost or corrupted using the verification data and the erasure codes.

20 Claims, 16 Drawing Sheets

(56) References Cited

U.S. PATENT DOCUMENTS

| | | | |
|---|---|---|---|
| 7,028,216 B2 | 4/2006 | Aizawa et al. |
| 7,028,218 B2 | 4/2006 | Schwarm et al. |
| 7,039,827 B2 | 5/2006 | Meyer et al. |
| 7,216,164 B1 | 5/2007 | Whitmore et al. |
| 7,783,682 B1 | 8/2010 | Patterson |
| 7,873,619 B1 | 1/2011 | Faibish et al. |
| 7,913,300 B1 | 3/2011 | Flank et al. |
| 7,933,936 B2 | 4/2011 | Aggarwal et al. |
| 7,979,613 B2 | 7/2011 | Zohar et al. |
| 8,086,652 B1 | 12/2011 | Bisson et al. |
| 8,117,464 B1 | 2/2012 | Kogelnik |
| 8,200,887 B2 | 6/2012 | Bennett |
| 8,205,065 B2 | 6/2012 | Matze |
| 8,352,540 B2 | 1/2013 | Anglin et al. |
| 8,527,544 B1 | 9/2013 | Colgrove et al. |
| 8,560,747 B1 | 10/2013 | Tan et al. |
| 8,621,241 B1 | 12/2013 | Stephenson |
| 8,700,875 B1 | 4/2014 | Barron et al. |
| 8,751,463 B1 | 6/2014 | Chamness |
| 8,806,160 B2 | 8/2014 | Colgrove et al. |
| 8,874,850 B1 | 10/2014 | Goodson et al. |
| 8,959,305 B1 | 2/2015 | Lecrone et al. |
| 9,081,713 B1 | 7/2015 | Bennett |
| 9,189,334 B2 | 11/2015 | Bennett |
| 9,311,182 B2 | 4/2016 | Bennett |
| 9,423,967 B2 | 8/2016 | Colgrove et al. |
| 9,436,396 B2 | 9/2016 | Colgrove et al. |
| 9,436,720 B2 | 9/2016 | Colgrove et al. |
| 9,454,476 B2 | 9/2016 | Colgrove et al. |
| 9,454,477 B2 | 9/2016 | Colgrove et al. |
| 9,513,820 B1 | 12/2016 | Shalev |
| 9,516,016 B2 | 12/2016 | Colgrove et al. |
| 9,552,248 B2 | 1/2017 | Miller et al. |
| 9,632,870 B2 | 4/2017 | Bennett |
| 2002/0038436 A1 | 3/2002 | Suzuki |
| 2002/0087544 A1 | 7/2002 | Selkirk et al. |
| 2002/0178335 A1 | 11/2002 | Selkirk et al. |
| 2003/0140209 A1 | 7/2003 | Testardi |
| 2004/0049572 A1 | 3/2004 | Yamamoto et al. |
| 2005/0066095 A1 | 3/2005 | Mullick et al. |
| 2005/0216535 A1 | 9/2005 | Saika et al. |
| 2005/0223154 A1 | 10/2005 | Uemura |
| 2006/0074940 A1 | 4/2006 | Craft et al. |
| 2006/0136365 A1 | 6/2006 | Kedem et al. |
| 2006/0155946 A1 | 7/2006 | Ji |
| 2007/0067585 A1 | 3/2007 | Ueda et al. |
| 2007/0109856 A1 | 5/2007 | Pellicone et al. |
| 2007/0162954 A1 | 7/2007 | Pela |
| 2007/0171562 A1 | 7/2007 | Maejima et al. |
| 2007/0174673 A1 | 7/2007 | Kawaguchi et al. |
| 2007/0220313 A1 | 9/2007 | Katsuragi et al. |
| 2007/0245090 A1 | 10/2007 | King et al. |
| 2007/0266179 A1 | 11/2007 | Chavan et al. |
| 2008/0059699 A1 | 3/2008 | Kubo et al. |
| 2008/0065852 A1 | 3/2008 | Moore et al. |
| 2008/0134174 A1 | 6/2008 | Sheu et al. |
| 2008/0155191 A1 | 6/2008 | Anderson et al. |
| 2008/0178040 A1 | 7/2008 | Kobayashi |
| 2008/0209096 A1 | 8/2008 | Lin et al. |
| 2008/0244205 A1 | 10/2008 | Amano et al. |
| 2008/0275928 A1 | 11/2008 | Shuster |
| 2008/0282045 A1 | 11/2008 | Biswas et al. |
| 2008/0285083 A1 | 11/2008 | Aonuma |
| 2008/0307270 A1 | 12/2008 | Li |
| 2009/0006587 A1 | 1/2009 | Richter |
| 2009/0037662 A1 | 2/2009 | La Frese et al. |
| 2009/0204858 A1 | 8/2009 | Kawaba |
| 2009/0228648 A1 | 9/2009 | Wack |
| 2009/0300084 A1 | 12/2009 | Whitehouse |
| 2010/0057673 A1 | 3/2010 | Savov |
| 2010/0058026 A1 | 3/2010 | Heil et al. |
| 2010/0067706 A1 | 3/2010 | Anan et al. |
| 2010/0077205 A1 | 3/2010 | Ekstrom et al. |
| 2010/0082879 A1 | 4/2010 | McKean et al. |
| 2010/0106905 A1 | 4/2010 | Kurashige et al. |
| 2010/0153620 A1 | 6/2010 | McKean et al. |
| 2010/0153641 A1 | 6/2010 | Jagadish et al. |
| 2010/0191897 A1 | 7/2010 | Zhang et al. |
| 2010/0250802 A1 | 9/2010 | Waugh et al. |
| 2010/0250882 A1 | 9/2010 | Hutchison et al. |
| 2010/0281225 A1 | 11/2010 | Chen et al. |
| 2010/0287327 A1 | 11/2010 | Li et al. |
| 2011/0072300 A1 | 3/2011 | Rousseau |
| 2011/0121231 A1 | 6/2011 | Haas et al. |
| 2011/0145598 A1 | 6/2011 | Smith et al. |
| 2011/0161559 A1 | 6/2011 | Yurzola et al. |
| 2011/0167221 A1 | 7/2011 | Pangal et al. |
| 2011/0238634 A1 | 9/2011 | Kobara |
| 2012/0023375 A1 | 1/2012 | Dutta et al. |
| 2012/0036309 A1 | 2/2012 | Dillow et al. |
| 2012/0117029 A1 | 5/2012 | Gold |
| 2012/0198175 A1 | 8/2012 | Atkisson |
| 2012/0330954 A1 | 12/2012 | Sivasubramanian et al. |
| 2013/0042052 A1 | 2/2013 | Colgrove et al. |
| 2013/0046995 A1 | 2/2013 | Movshovitz |
| 2013/0047029 A1 | 2/2013 | Ikeuchi et al. |
| 2013/0091102 A1 | 4/2013 | Nayak |
| 2013/0205110 A1 | 8/2013 | Kettner |
| 2013/0227236 A1 | 8/2013 | Flynn et al. |
| 2013/0275391 A1 | 10/2013 | Batwara et al. |
| 2013/0275656 A1 | 10/2013 | Talagala et al. |
| 2013/0283058 A1 | 10/2013 | Fiske et al. |
| 2013/0290648 A1 | 10/2013 | Shao et al. |
| 2013/0318314 A1 | 11/2013 | Markus et al. |
| 2013/0339303 A1 | 12/2013 | Potter et al. |
| 2014/0052946 A1 | 2/2014 | Kimmel |
| 2014/0068791 A1 | 3/2014 | Resch |
| 2014/0089730 A1 | 3/2014 | Watanabe et al. |
| 2014/0101361 A1 | 4/2014 | Gschwind |
| 2014/0143517 A1 | 5/2014 | Jin et al. |
| 2014/0172929 A1 | 6/2014 | Sedayao et al. |
| 2014/0201150 A1 | 7/2014 | Kumarasamy et al. |
| 2014/0215129 A1 | 7/2014 | Kuzmin et al. |
| 2014/0229131 A1 | 8/2014 | Cohen et al. |
| 2014/0229452 A1 | 8/2014 | Serita et al. |
| 2014/0281308 A1 | 9/2014 | Lango et al. |
| 2014/0325115 A1 | 10/2014 | Ramsundar et al. |
| 2015/0234709 A1 | 8/2015 | Koarashi |
| 2015/0244775 A1 | 8/2015 | Vibhor et al. |
| 2015/0278534 A1 | 10/2015 | Thiyagarajan et al. |
| 2016/0019114 A1 | 1/2016 | Han et al. |
| 2016/0098191 A1 | 4/2016 | Golden et al. |
| 2016/0098199 A1 | 4/2016 | Golden et al. |
| 2016/0293274 A1 | 10/2016 | Schuh et al. |
| 2018/0039543 A1* | 2/2018 | Luby .................. G06F 3/064 |
| 2018/0048592 A1 | 2/2018 | Worley et al. |
| 2018/0095872 A1 | 4/2018 | Dreier et al. |
| 2018/0239549 A1* | 8/2018 | Zhang ............. G06F 11/1076 |
| 2018/0289114 A1 | 10/2018 | Wheeler |
| 2018/0293134 A1* | 10/2018 | Jin ................... H03M 13/3761 |

FOREIGN PATENT DOCUMENTS

| | | |
|---|---|---|
| CN | 104025010 B | 11/2016 |
| EP | 3066610 A1 | 9/2016 |
| EP | 3082047 A1 | 10/2016 |
| EP | 3120235 A | 1/2017 |
| JP | 2007-087036 A | 4/2007 |
| JP | 2007-094472 A | 4/2007 |
| JP | 2008-250667 A | 10/2008 |
| JP | 2010-211681 A | 9/2010 |
| WO | WO-1995/002349 A1 | 1/1995 |
| WO | WO-1999/013403 A1 | 3/1999 |
| WO | WO-2008/102347 A1 | 8/2008 |
| WO | WO-2010/071655 A1 | 6/2010 |

OTHER PUBLICATIONS

Microsoft Corporation, "Fundamentals of Garbage Collection", Retrieved Aug. 30, 2013 via the WayBack Machine, 11 pages.

* cited by examiner

DYNAMIC DATA VERIFICATION AND RECOVERY IN A STORAGE SYSTEM

REFERENCE TO RELATED APPLICATIONS

This application is a continuation of U.S. application Ser. No. 15/665,128, filed Jul. 31, 2017, the entire contents of which are incorporated by reference herein.

BACKGROUND

Storage systems, such as enterprise storage systems, may include a centralized or decentralized repository for data that provides common data management, data protection, and data sharing functions, for example, through connections to computer systems.

BRIEF DESCRIPTION OF THE DRAWINGS

The present disclosure is illustrated by way of example, and not by way of limitation, and can be more fully understood with reference to the following detailed description when considered in connection with the figures as described below.

DETAILED DESCRIPTION

Figure 1A:
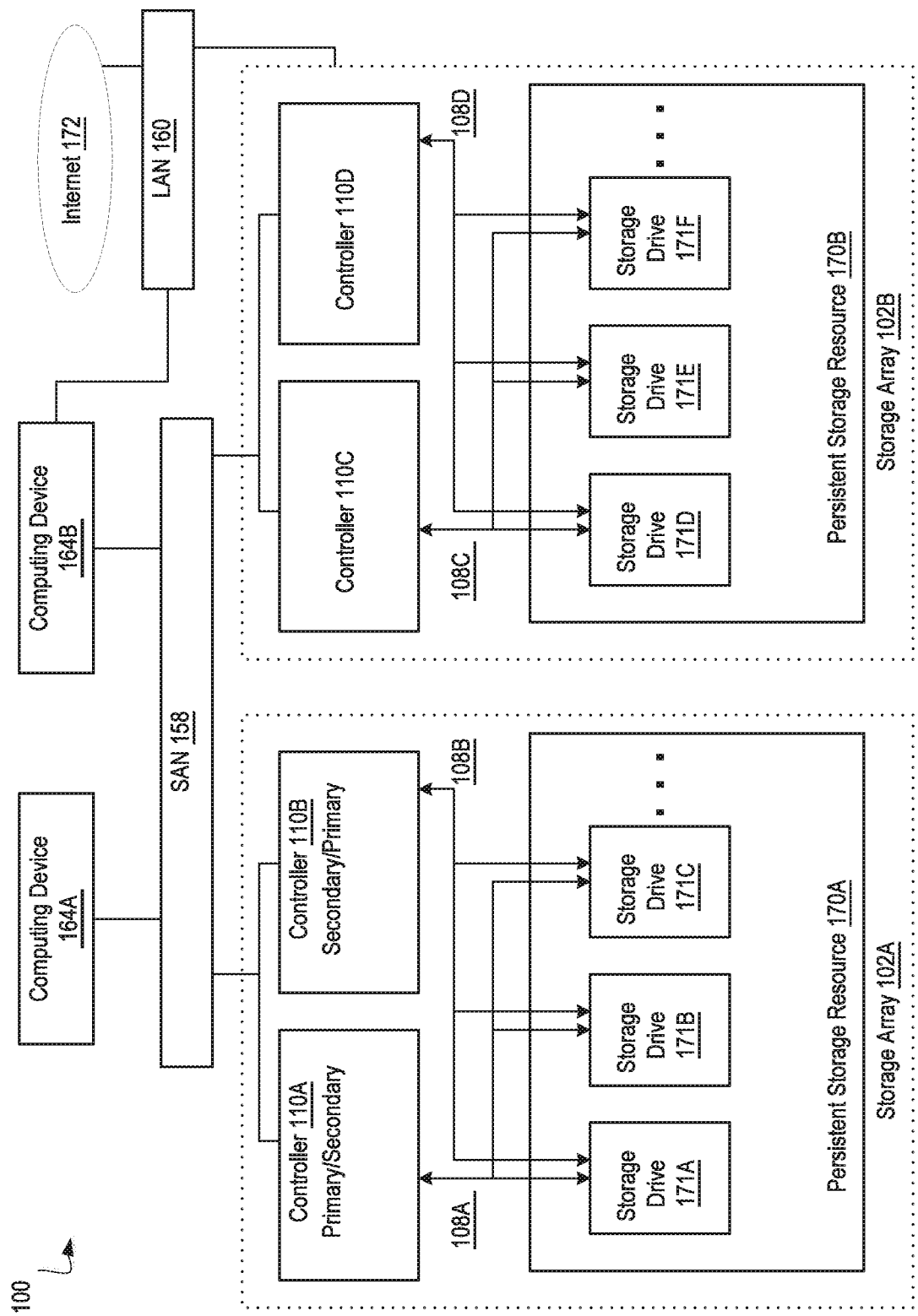
FIG. 1A illustrates a first example system for data storage in accordance with some implementations.

To protect against data loss, storage devices may include error detection and correction mechanisms. Often these mechanisms take the form of error correcting codes which are generated by the devices and stored within the devices themselves. In addition, distributed storage systems may also utilize decentralized algorithms to distribute data among a collection of storage devices. However, the difficult task remains of distributing data among multiple storage devices with varying capacities, input/output (I/O) characteristics and reliability issues.

Conventional hard drives (HDD) differ from solid state drives (SSD) in various aspects relating to protection against data loss. An SSD may emulate a HDD interface, but a SSD utilizes solid-state memory to store persistent data rather than the electromechanical devices found in a HDD. For example, an SSD may include banks of Flash memory. Without moving parts or mechanical delays, an SSD may have a lower access time and latency than a HDD. However, SSD typically have significant write latencies. In addition to different input/output (I/O) characteristics, an SSD experiences different failure modes than a HDD. Accordingly, high performance and high reliability may not be achieved in systems comprising SSDs for storage while utilizing distributed data placement algorithms developed for HDDs. This disclosure proposes an efficient method of distributing data and detecting and correcting To resolve the above deficiencies, in one implementation, processing logic may determine that data is to be written across a direct-mapped storage system that includes a plurality of flash storage devices. A plurality of available allocation units across the plurality of flash storage devices may be selected as the allocation units to where the data will be written. The plurality of allocation units may be dynamically associated together in a stripe, so that any future lost data may be recovered in view of the association. The processing logic then writes the data to a first subset of the allocation units. When data is modified and is to be rewritten, stripes are not written back into their original location. Instead, a new set of allocation units is selected and the data is written to the new stripe. Advantageously, this allows new parities to be created instead of reading each of the existing allocation units in the stripe to recalculate what the new parity should be. The data that is written to the first set of allocation units includes verification signatures (checksums) corresponding to the data. Using the verification data, processing logic can determine if any data has been lost or corrupted.

Erasure codes (e.g., parity bits 'P' and 'Q') corresponding to the data written to the first subset of allocation units may then be calculated and written to a second subset of allocation units. Parity bits may also be written to the allocation unit itself. Advantageously, this allows for the recovery of a bad block inside of an allocation unit from the internal parity, instead of relying on a parity stored on a second drive. Storing the erasure codes ensures that data lost on one or two drives is recoverable. In the case that an allocation unit fails or is corrupted, the failure or corruption is detected by comparing data in the allocation unit with the verification signatures (checksums). In response to the data being lost or corrupted, the data may be recovered from the corresponding allocation unit based on the data written to the first subset of allocation units (the other, healthy data) and the erasure codes.

FIG. 1A illustrates an example system for data storage, in accordance with some implementations. System 100 (also referred to as "storage system" herein) includes numerous elements for purposes of illustration rather than limitation. It may be noted that system 100 may include the same, more, or fewer elements configured in the same or different manner in other implementations.

System 100 includes a number of computing devices 164. Computing devices (also referred to as "client devices" herein) may be for example, a server in a data center, a workstation, a personal computer, a notebook, or the like. Computing devices 164 are coupled for data communications to one or more storage arrays 102 through a storage area network (SAN) 158 or a local area network (LAN) 160.

The SAN 158 may be implemented with a variety of data communications fabrics, devices, and protocols. For example, the fabrics for SAN 158 may include Fibre Channel, Ethernet, Infiniband, Serial Attached Small Computer System Interface (SAS), or the like. Data communications protocols for use with SAN 158 may include Advanced Technology Attachment (ATA), Fibre Channel Protocol, Small Computer System Interface (SCSI), Internet Small Computer System Interface (iSCSI), HyperSCSI, Non-Volatile Memory Express (NVMe) over Fabrics, or the like. It may be noted that SAN 158 is provided for illustration, rather than limitation. Other data communication couplings may be implemented between computing devices 164 and storage arrays 102.

The LAN 160 may also be implemented with a variety of fabrics, devices, and protocols. For example, the fabrics for LAN 160 may include Ethernet (802.3), wireless (802.11), or the like. Data communication protocols for use in LAN 160 may include Transmission Control Protocol (TCP), User Datagram Protocol (UDP), Internet Protocol (IP), HyperText Transfer Protocol (HTTP), Wireless Access Protocol (WAP), Handheld Device Transport Protocol (HDTP), Session Initiation Protocol (SIP), Real Time Protocol (RTP), or the like.

Storage arrays 102 may provide persistent data storage for the computing devices 164. Storage array 102A may be contained in a chassis (not shown), and storage array 102B may be contained in another chassis (not shown), in implementations. Storage array 102A and 102B may include one or more storage array controllers 110 (also referred to as "controller" and "system controller" herein). A storage array controller 110 may be embodied as a module of automated computing machinery comprising computer hardware, computer software, or a combination of computer hardware and software. In some implementations, the storage array controllers 110 may be configured to carry out various storage tasks. Storage tasks may include writing data received from the computing devices 164 to storage array 102, erasing data from storage array 102, retrieving data from storage array 102 and providing data to computing devices 164, monitoring and reporting of disk utilization and performance, performing redundancy operations, such as Redundant Array of Independent Drives (RAID) or RAID-like data redundancy operations, compressing data, encrypting data, and so forth.

Storage array controller 110 may be implemented in a variety of ways, including as a Field Programmable Gate Array (FPGA), a Programmable Logic Chip (PLC), an Application Specific Integrated Circuit (ASIC), System-on-Chip (SOC), or any computing device that includes discrete components such as a processing device, central processing unit, computer memory, or various adapters. Storage array controller 110 may include, for example, a data communications adapter configured to support communications via the SAN 158 or LAN 160. In some implementations, storage array controller 110 may be independently coupled to the LAN 160. In implementations, storage array controller 110 may include an I/O controller or the like that couples the storage array controller 110 for data communications, through a midplane (not shown), to a persistent storage resource 170 (also referred to as a "storage resource" herein). The persistent storage resource 170 main include any number of storage drives 171 (also referred to as "storage devices" herein) and any number of non-volatile Random Access Memory (NVRAM) devices (not shown).

In some implementations, the NVRAM devices of a persistent storage resource 170 may be configured to receive, from the storage array controller 110, data to be stored in the storage drives 171. In some examples, the data may originate from computing devices 164. In some examples, writing data to the NVRAM device may be carried out more quickly than directly writing data to the storage drive 171. In implementations, the storage array controller 110 may be configured to utilize the NVRAM devices as a quickly accessible buffer for data destined to be written to the storage drives 171. Latency for write requests using NVRAM devices as a buffer may be improved relative to a system in which a storage array controller 110 writes data directly to the storage drives 171. In some implementations, the NVRAM devices may be implemented with computer memory in the form of high bandwidth, low latency RAM. The NVRAM device is referred to as "non-volatile" because the NVRAM device may receive or include a unique power source that maintains the state of the RAM after main power loss to the NVRAM device. Such a power source may be a battery, one or more capacitors, or the like. In response to a power loss, the NVRAM device may be configured to write the contents of the RAM to a persistent storage, such as the storage drives 171.

In implementations, storage drive 171 may refer to any device configured to record data persistently, where "persistently" or "persistent" refers as to a device's ability to maintain recorded data after loss of power. In some implementations, storage drive 171 may correspond to non-disk storage media. For example, the storage drive 171 may be one or more solid-state drives (SSDs), flash memory based storage, any type of solid-state non-volatile memory, or any other type of non-mechanical storage device. In other implementations, storage drive 171 may include may include mechanical or spinning hard disk, such as hard-disk drives (HDD).

In some implementations, the storage array controllers 110 may be configured for offloading device management responsibilities from storage drive 171 in storage array 102. For example, storage array controllers 110 may manage control information that may describe the state of one or more memory blocks in the storage drives 171. The control information may indicate, for example, that a particular memory block has failed and should no longer be written to, that a particular memory block contains boot code for a storage array controller 110, the number of program-erase (P/E) cycles that have been performed on a particular memory block, the age of data stored in a particular memory block, the type of data that is stored in a particular memory block, and so forth. In some implementations, the control information may be stored with an associated memory block as metadata. In other implementations, the control information for the storage drives 171 may be stored in one or more particular memory blocks of the storage drives 171 that are selected by the storage array controller 110. The selected memory blocks may be tagged with an identifier indicating that the selected memory block contains control information. The identifier may be utilized by the storage array controllers 110 in conjunction with storage drives 171 to quickly identify the memory blocks that contain control information. For example, the storage controllers 110 may issue a command to locate memory blocks that contain control information. It may be noted that control information may be so large that parts of the control information may be stored in multiple locations, that the control information may be stored in multiple locations for purposes of redundancy, for example, or that the control information may otherwise be distributed across multiple memory blocks in the storage drive 171.

In implementations, storage array controllers 110 may offload device management responsibilities from storage drives 171 of storage array 102 by retrieving, from the storage drives 171, control information describing the state of one or more memory blocks in the storage drives 171. Retrieving the control information from the storage drives 171 may be carried out, for example, by the storage array controller 110 querying the storage drives 171 for the location of control information for a particular storage drive 171. The storage drives 171 may be configured to execute instructions that enable the storage drive 171 to identify the location of the control information. The instructions may be executed by a controller (not shown) associated with or otherwise located on the storage drive 171 and may cause the storage drive 171 to scan a portion of each memory block to identify the memory blocks that store control information for the storage drives 171. The storage drives 171 may respond by sending a response message to the storage array controller 110 that includes the location of control information for the storage drive 171. Responsive to receiving the response message, storage array controllers 110 may issue a request to read data stored at the address associated with the location of control information for the storage drives 171.

In other implementations, the storage array controllers 110 may further offload device management responsibilities from storage drives 171 by performing, in response to receiving the control information, a storage drive management operation. A storage drive management operation may include, for example, an operation that is typically performed by the storage drive 171 (e.g., the controller (not shown) associated with a particular storage drive 171). A storage drive management operation may include, for example, ensuring that data is not written to failed memory blocks within the storage drive 171, ensuring that data is written to memory blocks within the storage drive 171 in such a way that adequate wear leveling is achieved, and so forth.

In implementations, storage array 102 may implement two or more storage array controllers 110. For example, storage array 102A may include storage array controllers 110A and storage array controllers 110B. At a given instance, a single storage array controller 110 (e.g., storage array controller 110A) of a storage system 100 may be designated with primary status (also referred to as "primary controller" herein), and other storage array controllers 110 (e.g., storage array controller 110A) may be designated with secondary status (also referred to as "secondary controller" herein). The primary controller may have particular rights, such as permission to alter data in persistent storage resource 170 (e.g., writing data to persistent storage resource 170). At least some of the rights of the primary controller may supersede the rights of the secondary controller. For instance, the secondary controller may not have permission to alter data in persistent storage resource 170 when the primary controller has the right. The status of storage array controllers 110 may change. For example, storage array controller 110A may be designated with secondary status, and storage array controller 110B may be designated with primary status.

In some implementations, a primary controller, such as storage array controller 110A, may serve as the primary controller for one or more storage arrays 102, and a second controller, such as storage array controller 110B, may serve as the secondary controller for the one or more storage arrays 102. For example, storage array controller 110A may be the primary controller for storage array 102A and storage array 102B, and storage array controller 110B may be the secondary controller for storage array 102A and 102B. In some implementations, storage array controllers 110C and 110D (also referred to as "storage processing modules") may neither have primary or secondary status. Storage array controllers 110C and 110D, implemented as storage processing modules, may act as a communication interface between the primary and secondary controllers (e.g., storage array controllers 110A and 110B, respectively) and storage array 102B. For example, storage array controller 110A of storage array 102A may send a write request, via SAN 158, to storage array 102B. The write request may be received by both storage array controllers 110C and 110D of storage array 102B. Storage array controllers 110C and 110D facilitate the communication, e.g., send the write request to the appropriate storage drive 171. It may be noted that in some implementations storage processing modules may be used to increase the number of storage drives controlled by the primary and secondary controllers.

In implementations, storage array controllers 110 are communicatively coupled, via a midplane (not shown), to one or more storage drives 171 and to one or more NVRAM devices (not shown) that are included as part of a storage array 102. The storage array controllers 110 may be coupled to the midplane via one or more data communication links and the midplane may be coupled to the storage drives 171 and the NVRAM devices via one or more data communications links. The data communications links described herein are collectively illustrated by data communications links 108 and may include a Peripheral Component Interconnect Express (PCIe) bus, for example.

Figure 1B:
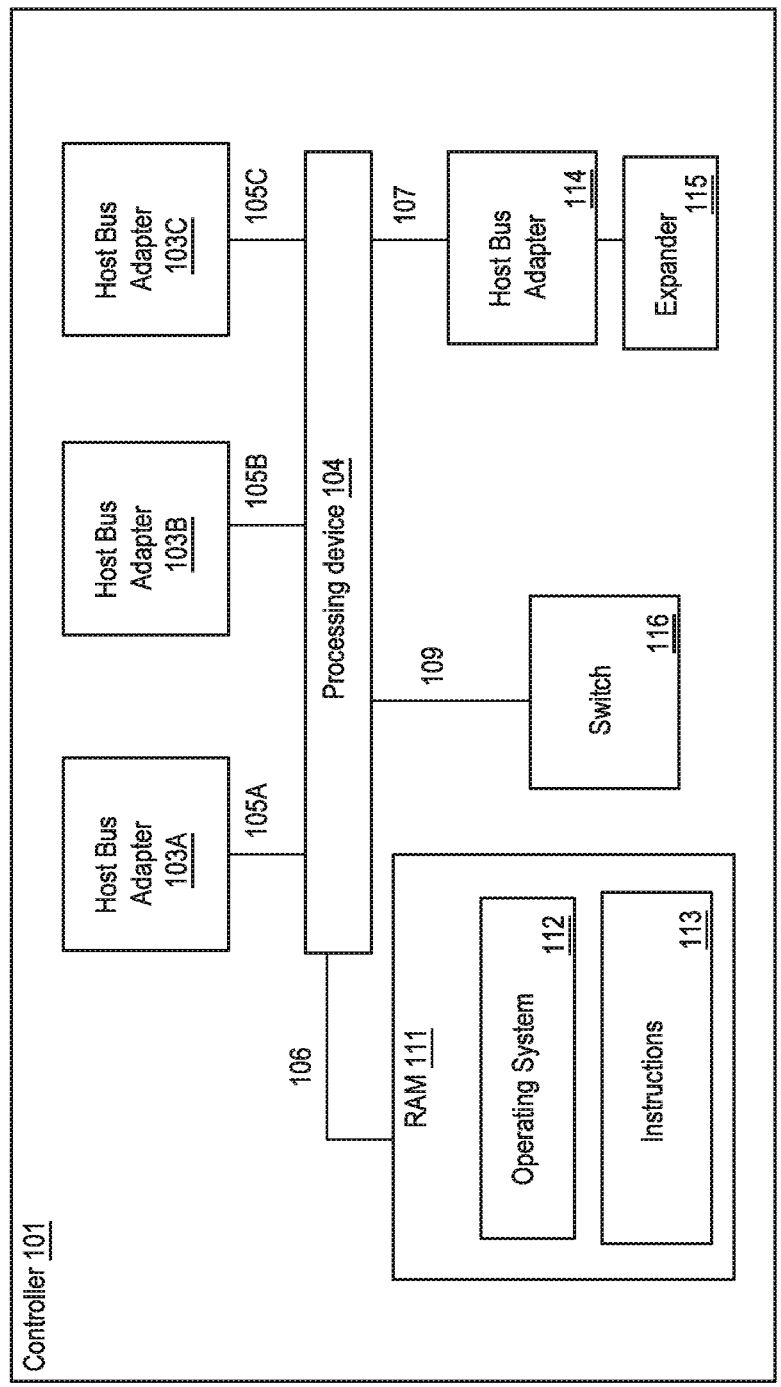
FIG. 1B illustrates a second example system for data storage in accordance with some implementations.

FIG. 1B illustrates an example system for data storage, in accordance with some implementations. Storage array controller 101 illustrated in FIG. 1B may similar to the storage array controllers 110 described with respect to FIG. 1A. In one example, storage array controller 101 may be similar to storage array controller 110A or storage array controller 110B. Storage array controller 101 includes numerous elements for purposes of illustration rather than limitation. It may be noted that storage array controller 101 may include the same, more, or fewer elements configured in the same or different manner in other implementations. It may be noted that elements of FIG. 1A may be included below to help illustrate features of storage array controller 101.

Storage array controller 101 may include one or more processing devices 104 and random access memory (RAM) 111. Processing device 104 (or controller 101) represents one or more general-purpose processing devices such as a microprocessor, central processing unit, or the like. More particularly, the processing device 104 (or controller 101) may be a complex instruction set computing (CISC) microprocessor, reduced instruction set computing (RISC) microprocessor, very long instruction word (VLIW) microprocessor, or a processor implementing other instruction sets or processors implementing a combination of instruction sets. The processing device 104 (or controller 101) may also be one or more special-purpose processing devices such as an application specific integrated circuit (ASIC), a field programmable gate array (FPGA), a digital signal processor (DSP), network processor, or the like.

The processing device 104 may be connected to the RAM 111 via a data communications link 106, which may be embodied as a high speed memory bus such as a Double-Data Rate 4 (DDR4) bus. Stored in RAM 111 is an operating system 112. In some implementations, instructions 113 are stored in RAM 111. Instructions 113 may include computer program instructions for performing operations in in a direct-mapped flash storage system. In one embodiment, a direct-mapped flash storage system is one that that addresses data blocks within flash drives directly and without an address translation performed by the storage controllers of the flash drives.

In implementations, storage array controller 101 includes one or more host bus adapters 103 that are coupled to the processing device 104 via a data communications link 105. In implementations, host bus adapters 103 may be computer hardware that connects a host system (e.g., the storage array controller) to other network and storage arrays. In some examples, host bus adapters 103 may be a Fibre Channel adapter that enables the storage array controller 101 to connect to a SAN, an Ethernet adapter that enables the storage array controller 101 to connect to a LAN, or the like. Host bus adapters 103 may be coupled to the processing device 104 via a data communications link 105 such as, for example, a PCIe bus.

In implementations, storage array controller 101 may include a host bus adapter 114 that is coupled to an expander 115. The expander 115 may be used to attach a host system to a larger number of storage drives. The expander 115 may, for example, be a SAS expander utilized to enable the host bus adapter 114 to attach to storage drives in an implementation where the host bus adapter 114 is embodied as a SAS controller.

In implementations, storage array controller 101 may include a switch 116 coupled to the processing device 104 via a data communications link 109. The switch 116 may be a computer hardware device that can create multiple endpoints out of a single endpoint, thereby enabling multiple devices to share a single endpoint. The switch 116 may, for example, be a PCIe switch that is coupled to a PCIe bus (e.g., data communications link 109) and presents multiple PCIe connection points to the midplane.

In implementations, storage array controller 101 includes a data communications link 107 for coupling the storage array controller 101 to other storage array controllers. In some examples, data communications link 107 may be a QuickPath Interconnect (QPI) interconnect.

A traditional storage system that uses traditional flash drives may implement a process across the flash drives that are part of the traditional storage system. For example, a higher level process of the storage system may initiate and control a process across the flash drives. However, a flash drive of the traditional storage system may include its own storage controller that also performs the process. Thus, for the traditional storage system, a higher level process (e.g., initiated by the storage system) and a lower level process (e.g., initiated by a storage controller of the storage system) may both be performed.

To resolve various deficiencies of a traditional storage system, operations may be performed by higher level processes and not by the lower level processes. For example, the flash storage system may include flash drives that do not include storage controllers that provide the process. Thus, the operating system of the flash storage system itself may initiate and control the process. This may be accomplished by a direct-mapped flash storage system that addresses data blocks within the flash drives directly and without an address translation performed by the storage controllers of the flash drives.

The operating system of the flash storage system may identify and maintain a list of allocation units across multiple flash drives of the flash storage system. The allocation units may be entire erase blocks or multiple erase blocks. The operating system may maintain a map or address range that directly maps addresses to erase blocks of the flash drives of the flash storage system.

Direct mapping to the erase blocks of the flash drives may be used to rewrite data and erase data. For example, the operations may be performed on one or more allocation units that include a first data and a second data where the first data is to be retained and the second data is no longer being used by the flash storage system. The operating system may initiate the process to write the first data to new locations within other allocation units and erasing the second data and marking the allocation units as being available for use for subsequent data. Thus, the process may only be performed by the higher level operating system of the flash storage system without an additional lower level process being performed by controllers of the flash drives.

Advantages of the process being performed only by the operating system of the flash storage system include increased reliability of the flash drives of the flash storage system as unnecessary or redundant write operations are not being performed during the process. One possible point of novelty here is the concept of initiating and controlling the process at the operating system of the flash storage system. In addition, the process can be controlled by the operating system across multiple flash drives. This is contrast to the process being performed by a storage controller of a flash drive.

A storage system can consist of two storage array controllers that share a set of drives for failover purposes, or it could consist of a single storage array controller that provides a storage service that utilizes multiple drives, or it could consist of a distributed network of storage array controllers each with some number of drives or some amount of Flash storage where the storage array controllers in the network collaborate to provide a complete storage service and collaborate on various aspects of a storage service including storage allocation and garbage collection.

Figure 1C:
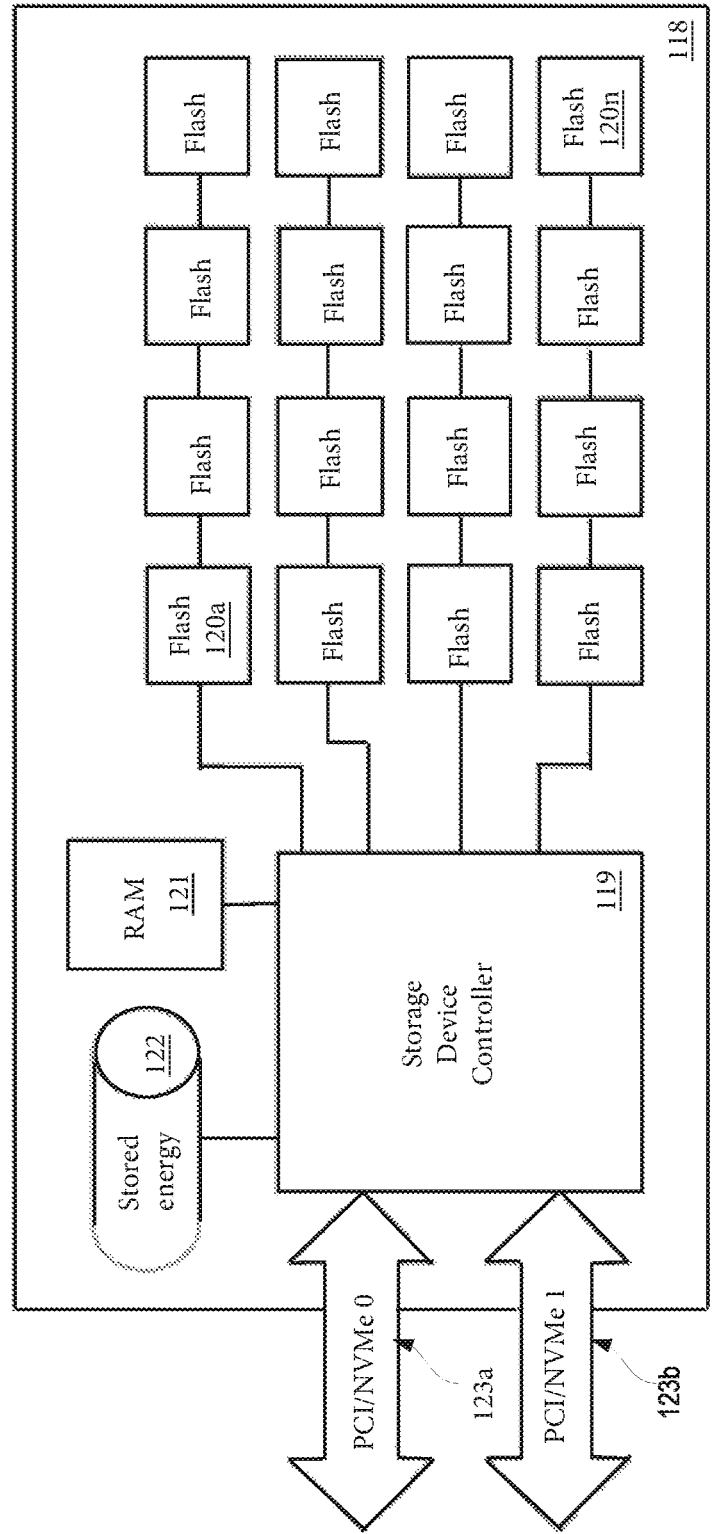
FIG. 1C illustrates a third example system for data storage in accordance with some implementations.

FIG. 1C illustrates a third example system 117 for data storage in accordance with some implementations. System 117 (also referred to as "storage system" herein) includes numerous elements for purposes of illustration rather than limitation. It may be noted that system 117 may include the same, more, or fewer elements configured in the same or different manner in other implementations.

In one embodiment, system 117 includes a dual Peripheral Component Interconnect (PCI) flash storage device 118 with separately addressable fast write storage. System 117 may include a storage controller 119. In one embodiment, storage controller 119 may be a CPU, ASIC, FPGA, or any other circuitry that may implement control structures necessary according to the present disclosure. In one embodiment, system 117 includes flash memory devices (e.g., including flash memory devices 120a-n), operatively coupled to various channels of the storage device controller 119. Flash memory devices 120a-n, may be presented to the controller 119 as an addressable collection of Flash pages, erase blocks, and/or control elements sufficient to allow the storage device controller 119 to program and retrieve various aspects of the Flash. In one embodiment, storage device controller 119 may perform operations on flash memory devices 120A-N including storing and retrieving data content of pages, arranging and erasing any blocks, tracking statistics related to the use and reuse of Flash memory pages, erase blocks, and cells, tracking and predicting error codes and faults within the Flash memory, controlling voltage levels associated with programming and retrieving contents of Flash cells, etc.

In one embodiment, system 117 may include random access memory (RAM) 121 to store separately addressable fast-write data. In one embodiment, RAM 121 may be one or more separate discrete devices. In another embodiment, RAM 121 may be integrated into storage device controller 119 or multiple storage device controllers. The RAM 121 may be utilized for other purposes as well, such as temporary program memory for a processing device (E.g., a central processing unit (CPU)) in the storage device controller 119.

In one embodiment, system 119 may include a stored energy device 122, such as a rechargeable battery or a capacitor. Stored energy device 122 may store energy sufficient to power the storage device controller 119, some amount of the RAM (e.g., RAM 121), and some amount of Flash memory (e.g., Flash memory 120a-120n) for sufficient time to write the contents of RAM to Flash memory. In one embodiment, storage device controller 119 may write the contents of RAM to Flash Memory if the storage device controller detects loss of external power.

In one embodiment, system 117 includes two data communications links 123a, 123b. In one embodiment, data communications links 123a, 123b may be PCI interfaces. In another embodiment, data communications links 123a, 123b may be based on other communications standards (e.g., HyperTransport, InfiBand, etc.). Data communications links 123a, 123b may be based on non-volatile memory express (NVMe) or NCMe over fabrics (NVMf) specifications that allow external connection to the storage device controller 119 from other components in the storage system 117. It should be noted that data communications links may be interchangeably referred to herein as PCI buses for convenience.

System 117 may also include an external power source (not shown), which may be provided over one or both data communications links 123a, 123b, or which may be provided separately. An alternative embodiment includes a separate Flash memory (not shown) dedicated for use in storing the content of RAM 121. The storage device controller 119 may present a logical device over a PCI bus which may include an addressable fast-write logical device, or a distinct part of the logical address space of the storage device 118, which may be presented as PCI memory or as persistent storage. In one embodiment, operations to store into the device are directed into the RAM 121. On power failure, the storage device controller 119 may write stored content associated with the addressable fast-write logical storage to Flash memory (e.g., Flash memory 120a-n) for long-term persistent storage.

In one embodiment, the logical device may include some presentation of some or all of the content of the Flash memory devices 120a-n, where that presentation allows a storage system including a storage device 118 (e.g., storage system 117) to directly address Flash memory pages and directly reprogram erase blocks from storage system components that are external to the storage device through the PCI bus. The presentation may also allow one or more of the external components to control and retrieve other aspects of the Flash memory including some or all of: tracking statistics related to use and reuse of Flash memory pages, erase blocks, and cells across all the Flash memory devices; tracking and predicting error codes and faults within and across the Flash memory devices; controlling voltage levels associated with programming and retrieving contents of Flash cells; etc.

In one embodiment, the stored energy device 122 may be sufficient to ensure completion of in-progress operations to the Flash memory devices 107a-120n stored energy device 122 may power storage device controller 119 and associated Flash memory devices (e.g., 120a-n) for those operations, as well as for the storing of fast-write RAM to Flash memory. Stored energy device 122 may be used to store accumulated statistics and other parameters kept and tracked by the Flash memory devices 120a-n and/or the storage device controller 119. Separate capacitors or stored energy devices (such as smaller capacitors near or embedded within the Flash memory devices themselves) may be used for some or all of the operations described herein.

Various schemes may be used to track and optimize the life span of the stored energy component, such as adjusting voltage levels over time, partially discharging the storage energy device 122 to measure corresponding discharge characteristics, etc. If the available energy decreases over time, the effective available capacity of the addressable fast-write storage may be decreased to ensure that it can be written safely based on the currently available stored energy.

Figure 1D:
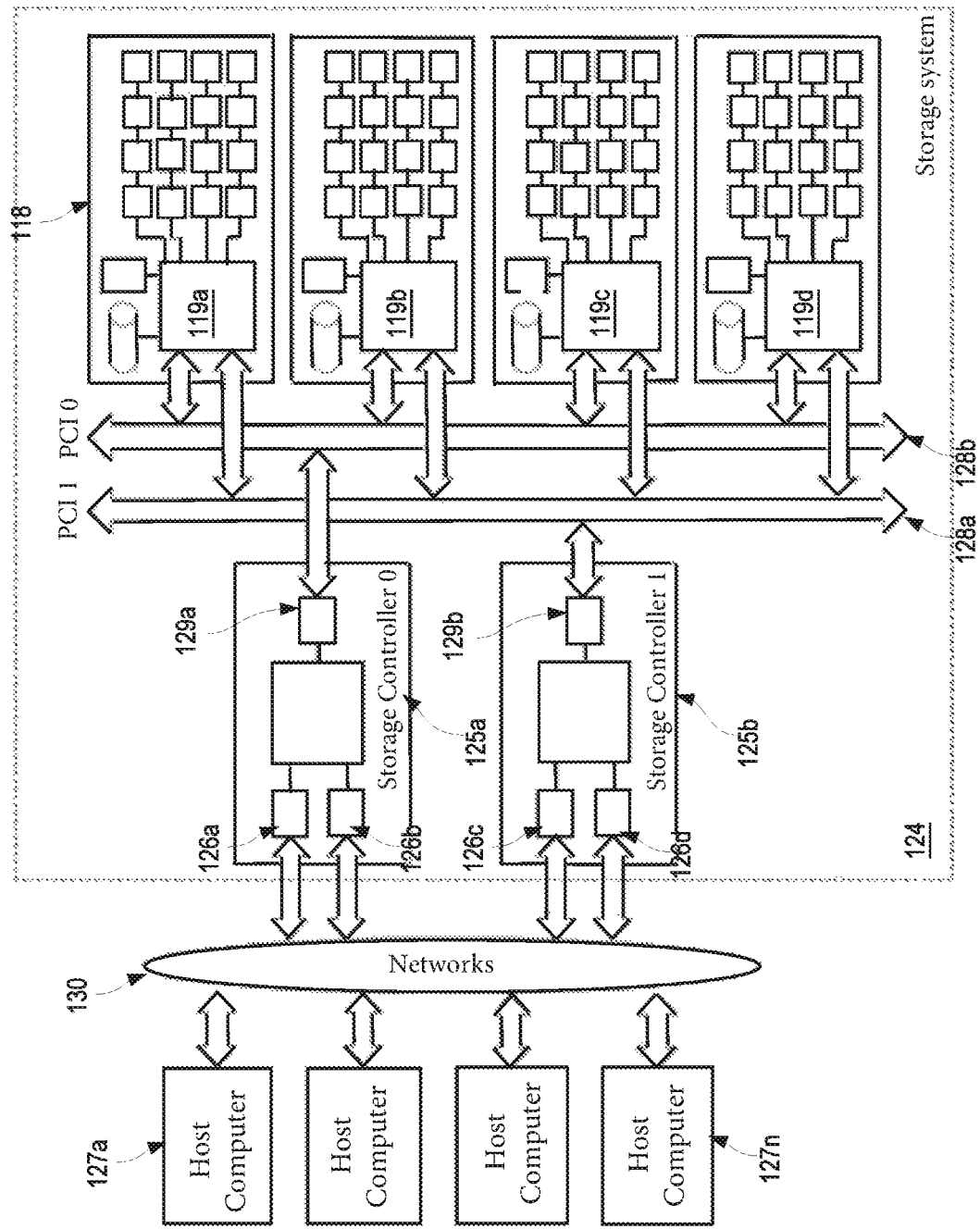
FIG. 1D illustrates a fourth example system for data storage in accordance with some implementations.

FIG. 1D illustrates a third example system 124 for data storage in accordance with some implementations. In one embodiment, system 124 includes storage controllers 125a, 125b. In one embodiment, storage controllers 125a, 125b are operatively coupled to Dual PCI storage devices 119a, 119b and 119c, 119d, respectively. Storage controllers 125a, 125b may be operatively coupled (e.g., via a storage network 130) to some number of host computers 127a-n.

In one embodiment, two storage controllers (e.g., 125a and 125b) provide storage services, such as a small computer system interface (SCSI) block storage array, a file server, an object server, a database or data analytics service, etc. The storage controllers 125a, 125b may provide services through some number of network interfaces (e.g., 126a-d) to host computers 127a-n outside of the storage system 124. Storage controllers 125a, 125b may provide integrated services or an application entirely within the storage system 124, forming a converged storage and compute system. The storage controllers 125a, 125b may utilize the fast write memory within or across storage devices 119a-d to journal in progress operations to ensure the operations are not lost on a power failure, storage controller removal, storage controller or storage system shutdown, or some fault of one or more software or hardware components within the storage system 124.

In one embodiment, controllers 125a, 125b operate as PCI masters to one or the other PCI buses 128a, 128b. In another embodiment, 128a and 128b may be based on other communications standards (e.g., HyperTransport, InfiBand, etc.). Other storage system embodiments may operate storage controllers 125a, 125b as multi-masters for both PCI buses 128a, 128b. Alternately, a PCI/NVMe/NVMf switching infrastructure or fabric may connect multiple storage controllers. Some storage system embodiments may allow storage devices to communicate with each other directly rather than communicating only with storage controllers. In one embodiment, a storage device controller 119a may be operable under direction from a storage controller 125a to synthesize and transfer data to be stored into Flash memory devices from data that has been stored in RAM (e.g., RAM 121 of FIG. 1C). For example, a recalculated version of RAM content may be transferred after a storage controller has determined that an operation has fully committed across the storage system, or when fast-write memory on the device has reached a certain used capacity, or after a certain amount of time, to ensure improve safety of the data or to release addressable fast-write capacity for reuse. This mechanism may be used, for example, to avoid a second transfer over a bus (e.g., 128a, 128b) from the storage controllers 125a, 125b. In one embodiment, a recalculation may include compressing data, attaching indexing or other metadata, combining multiple data segments together, performing erasure code calculations, etc.

In one embodiment, under direction from a storage controller 125a, 125b, a storage device controller 119a, 119b may be operable to calculate and transfer data to other storage devices from data stored in RAM (e.g., RAM 121 of FIG. 1C) without involvement of the storage controllers 125a, 125b. This operation may be used to mirror data stored in one controller 125a to another controller 125b, or it could be used to offload compression, data aggregation, and/or erasure coding calculations and transfers to storage devices to reduce load on storage controllers or the storage controller interface 129a, 129b to the PCI bus 128a, 128b.

A storage device controller 119 may include mechanisms for implementing high availability primitives for use by other parts of a storage system external to the Dual PCI storage device 118. For example, reservation or exclusion primitives may be provided so that, in a storage system with two storage controllers providing a highly available storage service, one storage controller may prevent the other storage controller from accessing or continuing to access the storage device. This could be used, for example, in cases where one controller detects that the other controller is not functioning properly or where the interconnect between the two storage controllers may itself not be functioning properly.

In one embodiment, a storage system for use with Dual PCI direct mapped storage devices with separately addressable fast write storage includes systems that manage erase blocks or groups of erase blocks as allocation units for storing data on behalf of the storage service, or for storing metadata (e.g., indexes, logs, etc.) associated with the storage service, or for proper management of the storage system itself. Flash pages, which may be a few kilobytes in size, may be written as data arrives or as the storage system is to persist data for long intervals of time (e.g., above a defined threshold of time). To commit data more quickly, or to reduce the number of writes to the Flash memory devices, the storage controllers may first write data into the separately addressable fast write storage on one more storage devices.

In one embodiment, the storage controllers 125a, 125b may initiate the use of erase blocks within and across storage devices (e.g., 118) in accordance with an age and expected remaining lifespan of the storage devices, or based on other statistics. The storage controllers 125a, 125b may initiate garbage collection and data migration data between storage devices in accordance with pages that are no longer needed as well as to manage Flash page and erase block lifespans and to manage overall system performance.

In one embodiment, the storage system 124 may utilize mirroring and/or erasure coding schemes as part of storing data into addressable fast write storage and/or as part of writing data into allocation units associated with erase blocks. Erasure codes may be used across storage devices, as well as within erase blocks or allocation units, or within and across Flash memory devices on a single storage device, to provide redundancy against single or multiple storage device failures or to protect against internal corruptions of Flash memory pages resulting from Flash memory operations or from degradation of Flash memory cells. Mirroring and erasure coding at various levels may be used to recover from multiple types of failures that occur separately or in combination.

The embodiments depicted with reference to FIGS. 2A-G illustrate a storage cluster that stores user data, such as user data originating from one or more user or client systems or other sources external to the storage cluster. The storage cluster distributes user data across storage nodes housed within a chassis, or across multiple chassis, using erasure coding and redundant copies of metadata. Erasure coding refers to a method of data protection or reconstruction in which data is stored across a set of different locations, such as disks, storage nodes or geographic locations. Flash memory is one type of solid-state memory that may be integrated with the embodiments, although the embodiments may be extended to other types of solid-state memory or other storage medium, including non-solid state memory. Control of storage locations and workloads are distributed across the storage locations in a clustered peer-to-peer system. Tasks such as mediating communications between the various storage nodes, detecting when a storage node has become unavailable, and balancing I/Os (inputs and outputs) across the various storage nodes, are all handled on a distributed basis. Data is laid out or distributed across multiple storage nodes in data fragments or stripes that support data recovery in some embodiments. Ownership of data can be reassigned within a cluster, independent of input and output patterns. This architecture described in more detail below allows a storage node in the cluster to fail, with the system remaining operational, since the data can be reconstructed from other storage nodes and thus remain available for input and output operations. In various embodiments, a storage node may be referred to as a cluster node, a blade, or a server.

The storage cluster may be contained within a chassis, i.e., an enclosure housing one or more storage nodes. A mechanism to provide power to each storage node, such as a power distribution bus, and a communication mechanism, such as a communication bus that enables communication between the storage nodes are included within the chassis. The storage cluster can run as an independent system in one location according to some embodiments. In one embodiment, a chassis contains at least two instances of both the power distribution and the communication bus which may be enabled or disabled independently. The internal communication bus may be an Ethernet bus, however, other technologies such as Peripheral Component Interconnect (PCI) Express, InfiniBand, and others, are equally suitable. The chassis provides a port for an external communication bus for enabling communication between multiple chassis, directly or through a switch, and with client systems. The external communication may use a technology such as Ethernet, InfiniBand, Fibre Channel, etc. In some embodiments, the external communication bus uses different communication bus technologies for inter-chassis and client communication. If a switch is deployed within or between chassis, the switch may act as a translation between multiple protocols or technologies. When multiple chassis are connected to define a storage cluster, the storage cluster may be accessed by a client using either proprietary interfaces or standard interfaces such as network file system (NFS), common internet file system (CIFS), small computer system interface (SCSI) or hypertext transfer protocol (HTTP). Translation from the client protocol may occur at the switch, chassis external communication bus or within each storage node. In some embodiments, multiple chassis may be coupled or connected to each other through an aggregator switch. A portion and/or all of the coupled or connected chassis may be designated as a storage cluster. As discussed above, each chassis can have multiple blades, each blade has a MAC (media access control) address, but the storage cluster is presented to an external network as having a single cluster IP (Internet Protocol) address and a single MAC address in some embodiments.

Each storage node may be one or more storage servers and each storage server is connected to one or more non-volatile solid state memory units, which may be referred to as storage units or storage devices. One embodiment includes a single storage server in each storage node and between one to eight non-volatile solid state memory units, however this one example is not meant to be limiting. The storage server may include a processor, dynamic random access memory (DRAM) and interfaces for the internal communication bus and power distribution for each of the power buses. Inside the storage node, the interfaces and storage unit share a communication bus, e.g., PCI Express, in some embodiments. The non-volatile solid state memory units may directly access the internal communication bus interface through a storage node communication bus, or request the storage node to access the bus interface. The non-volatile solid state memory unit contains an embedded central processing unit (CPU), solid state storage controller, and a quantity of solid state mass storage, e.g., between 2-32 terabytes (TB) in some embodiments. An embedded volatile storage medium, such as DRAM, and an energy reserve apparatus are included in the non-volatile solid state memory unit. In some embodiments, the energy reserve apparatus is a capacitor, super-capacitor, or battery that enables transferring a subset of DRAM contents to a stable storage medium in the case of power loss. In some embodiments, the non-volatile solid state memory unit is constructed with a storage class memory, such as phase change or magnetoresistive random access memory (MRAM) that substitutes for DRAM and enables a reduced power hold-up apparatus.

One of many features of the storage nodes and non-volatile solid state storage is the ability to proactively rebuild data in a storage cluster. The storage nodes and non-volatile solid state storage can determine when a storage node or non-volatile solid state storage in the storage cluster is unreachable, independent of whether there is an attempt to read data involving that storage node or non-volatile solid state storage. The storage nodes and non-volatile solid state storage then cooperate to recover and rebuild the data in at least partially new locations. This constitutes a proactive rebuild, in that the system rebuilds data without waiting until the data is needed for a read access initiated from a client system employing the storage cluster. These and further details of the storage memory and operation thereof are discussed below.

Figure 2A:
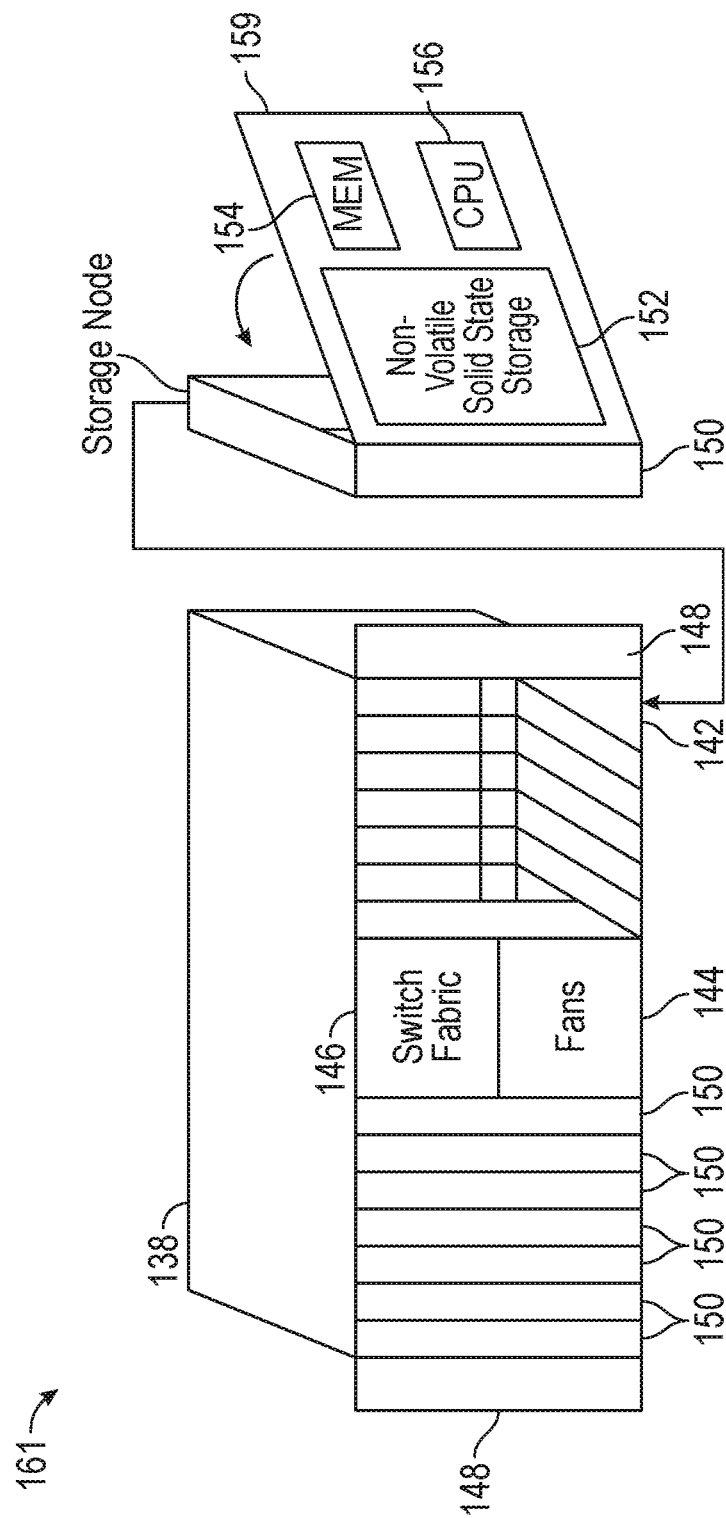
FIG. 2A is a perspective view of a storage cluster with multiple storage nodes and internal storage coupled to each storage node to provide network attached storage, in accordance with some embodiments.

FIG. 2A is a perspective view of a storage cluster 161, with multiple storage nodes 150 and internal solid-state memory coupled to each storage node to provide network attached storage or storage area network, in accordance with some embodiments. A network attached storage, storage area network, or a storage cluster, or other storage memory, could include one or more storage clusters 161, each having one or more storage nodes 150, in a flexible and reconfigurable arrangement of both the physical components and the amount of storage memory provided thereby. The storage cluster 161 is designed to fit in a rack, and one or more racks can be set up and populated as desired for the storage memory. The storage cluster 161 has a chassis 138 having multiple slots 142. It should be appreciated that chassis 138 may be referred to as a housing, enclosure, or rack unit. In one embodiment, the chassis 138 has fourteen slots 142, although other numbers of slots are readily devised. For example, some embodiments have four slots, eight slots, sixteen slots, thirty-two slots, or other suitable number of slots. Each slot 142 can accommodate one storage node 150 in some embodiments. Chassis 138 includes flaps 148 that can be utilized to mount the chassis 138 on a rack. Fans 144 provide air circulation for cooling of the storage nodes 150 and components thereof, although other cooling components could be used, or an embodiment could be devised without cooling components. A switch fabric 146 couples storage nodes 150 within chassis 138 together and to a network for communication to the memory. In an embodiment depicted in FIG. 1, the slots 142 to the left of the switch fabric 146 and fans 144 are shown occupied by storage nodes 150, while the slots 142 to the right of the switch fabric 146 and fans 144 are empty and available for insertion of storage node 150 for illustrative purposes. This configuration is one example, and one or more storage nodes 150 could occupy the slots 142 in various further arrangements. The storage node arrangements need not be sequential or adjacent in some embodiments. Storage nodes 150 are hot pluggable, meaning that a storage node 150 can be inserted into a slot 142 in the chassis 138, or removed from a slot 142, without stopping or powering down the system. Upon insertion or removal of storage node 150 from slot 142, the system automatically reconfigures in order to recognize and adapt to the change. Reconfiguration, in some embodiments, includes restoring redundancy and/or rebalancing data or load.

Each storage node 150 can have multiple components. In the embodiment shown here, the storage node 150 includes a printed circuit board 159 populated by a CPU 156, i.e., processor, a memory 154 coupled to the CPU 156, and a non-volatile solid state storage 152 coupled to the CPU 156, although other mountings and/or components could be used in further embodiments. The memory 154 has instructions which are executed by the CPU 156 and/or data operated on by the CPU 156. As further explained below, the non-volatile solid state storage 152 includes flash or, in further embodiments, other types of solid-state memory.

Referring to FIG. 2A, storage cluster 161 is scalable, meaning that storage capacity with non-uniform storage sizes is readily added, as described above. One or more storage nodes 150 can be plugged into or removed from each chassis and the storage cluster self-configures in some embodiments. Plug-in storage nodes 150, whether installed in a chassis as delivered or later added, can have different sizes. For example, in one embodiment a storage node 150 can have any multiple of 4 TB, e.g., 8 TB, 12 TB, 16 TB, 32 TB, etc. In further embodiments, a storage node 150 could have any multiple of other storage amounts or capacities.

Storage capacity of each storage node 150 is broadcast, and influences decisions of how to stripe the data. For maximum storage efficiency, an embodiment can self-configure as wide as possible in the stripe, subject to a predetermined requirement of continued operation with loss of up to one, or up to two, non-volatile solid state storage units 152 or storage nodes 150 within the chassis.

Figure 2B:
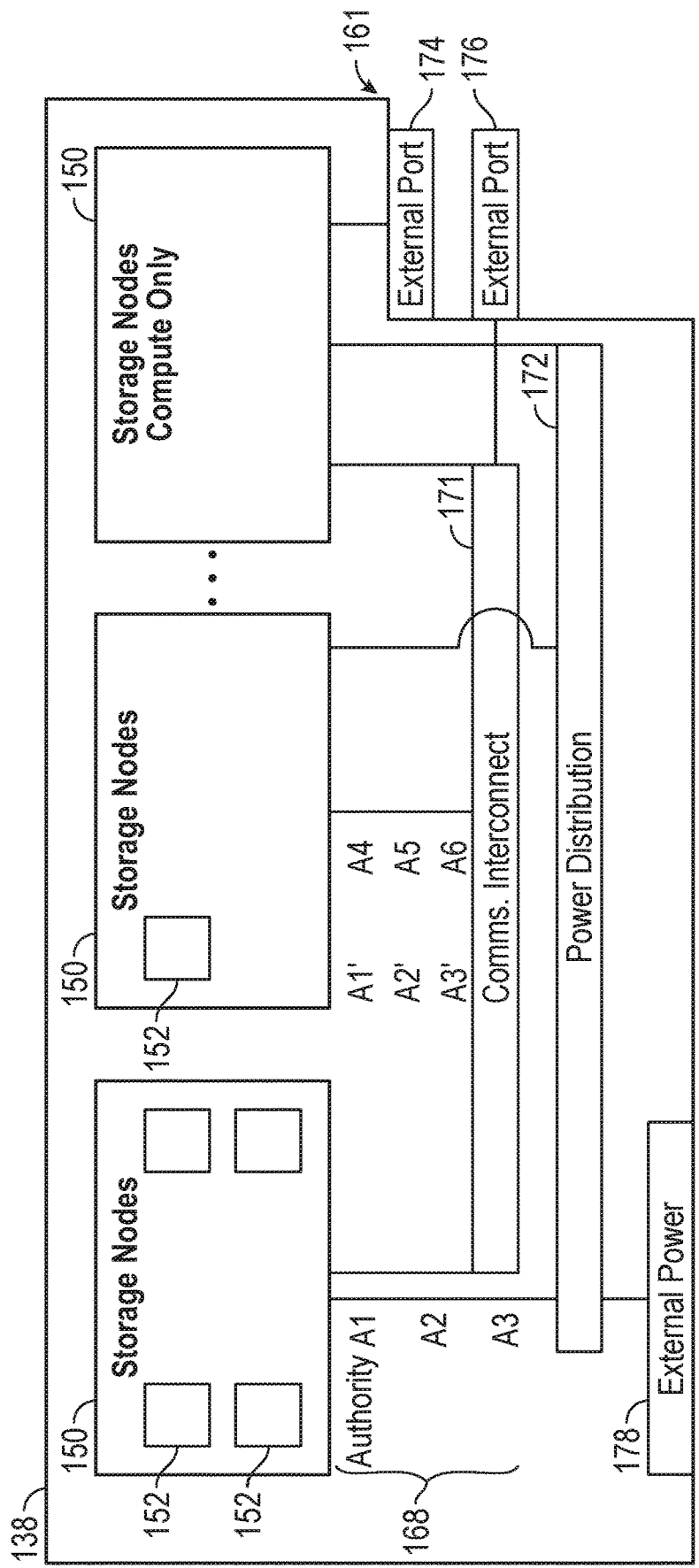
FIG. 2B is a block diagram showing an interconnect switch coupling multiple storage nodes in accordance with some embodiments.

FIG. 2B is a block diagram showing a communications interconnect 171 and power distribution bus 172 coupling multiple storage nodes 150. Referring back to FIG. 2A, the communications interconnect 171 can be included in or implemented with the switch fabric 146 in some embodiments. Where multiple storage clusters 161 occupy a rack, the communications interconnect 171 can be included in or implemented with a top of rack switch, in some embodiments. As illustrated in FIG. 2B, storage cluster 161 is enclosed within a single chassis 138. External port 176 is coupled to storage nodes 150 through communications interconnect 171, while external port 174 is coupled directly to a storage node. External power port 178 is coupled to power distribution bus 172. Storage nodes 150 may include varying amounts and differing capacities of non-volatile solid state storage 152 as described with reference to FIG. 2A. In addition, one or more storage nodes 150 may be a compute only storage node as illustrated in FIG. 2B. Authorities 168 are implemented on the non-volatile solid state storages 152, for example as lists or other data structures stored in memory. In some embodiments the authorities are stored within the non-volatile solid state storage 152 and supported by software executing on a controller or other processor of the non-volatile solid state storage 152. In a further embodiment, authorities 168 are implemented on the storage nodes 150, for example as lists or other data structures stored in the memory 154 and supported by software executing on the CPU 156 of the storage node 150. Authorities 168 control how and where data is stored in the non-volatile solid state storages 152 in some embodiments. This control assists in determining which type of erasure coding scheme is applied to the data, and which storage nodes 150 have which portions of the data. Each authority 168 may be assigned to a non-volatile solid state storage 152. Each authority may control a range of inode numbers, segment numbers, or other data identifiers which are assigned to data by a file system, by the storage nodes 150, or by the non-volatile solid state storage 152, in various embodiments.

Every piece of data, and every piece of metadata, has redundancy in the system in some embodiments. In addition, every piece of data and every piece of metadata has an owner, which may be referred to as an authority. If that authority is unreachable, for example through failure of a storage node, there is a plan of succession for how to find that data or that metadata. In various embodiments, there are redundant copies of authorities 168. Authorities 168 have a relationship to storage nodes 150 and non-volatile solid state storage 152 in some embodiments. Each authority 168, covering a range of data segment numbers or other identifiers of the data, may be assigned to a specific non-volatile solid state storage 152. In some embodiments the authorities 168 for all of such ranges are distributed over the non-volatile solid state storages 152 of a storage cluster. Each storage node 150 has a network port that provides access to the non-volatile solid state storage(s) 152 of that storage node 150. Data can be stored in a segment, which is associated with a segment number and that segment number is an indirection for a configuration of a RAID (redundant array of independent disks) stripe in some embodiments. The assignment and use of the authorities 168 thus establishes an indirection to data. Indirection may be referred to as the ability to reference data indirectly, in this case via an authority 168, in accordance with some embodiments. A segment identifies a set of non-volatile solid state storage 152 and a local identifier into the set of non-volatile solid state storage 152 that may contain data. In some embodiments, the local identifier is an offset into the device and may be reused sequentially by multiple segments. In other embodiments the local identifier is unique for a specific segment and never reused. The offsets in the non-volatile solid state storage 152 are applied to locating data for writing to or reading from the non-volatile solid state storage 152 (in the form of a RAID stripe). Data is striped across multiple units of non-volatile solid state storage 152, which may include or be different from the non-volatile solid state storage 152 having the authority 168 for a particular data segment.

If there is a change in where a particular segment of data is located, e.g., during a data move or a data reconstruction, the authority 168 for that data segment should be consulted, at that non-volatile solid state storage 152 or storage node 150 having that authority 168. In order to locate a particular piece of data, embodiments calculate a hash value for a data segment or apply an inode number or a data segment number. The output of this operation points to a non-volatile solid state storage 152 having the authority 168 for that particular piece of data. In some embodiments there are two stages to this operation. The first stage maps an entity identifier (ID), e.g., a segment number, inode number, or directory number to an authority identifier. This mapping may include a calculation such as a hash or a bit mask. The second stage is mapping the authority identifier to a particular non-volatile solid state storage 152, which may be done through an explicit mapping. The operation is repeatable, so that when the calculation is performed, the result of the calculation repeatably and reliably points to a particular non-volatile solid state storage 152 having that authority 168. The operation may include the set of reachable storage nodes as input. If the set of reachable non-volatile solid state storage units changes the optimal set changes. In some embodiments, the persisted value is the current assignment (which is always true) and the calculated value is the target assignment the cluster will attempt to reconfigure towards. This calculation may be used to determine the optimal non-volatile solid state storage 152 for an authority in the presence of a set of non-volatile solid state storage 152 that are reachable and constitute the same cluster. The calculation also determines an ordered set of peer non-volatile solid state storage 152 that will also record the authority to non-volatile solid state storage mapping so that the authority may be determined even if the assigned non-volatile solid state storage is unreachable. A duplicate or substitute authority 168 may be consulted if a specific authority 168 is unavailable in some embodiments.

With reference to FIGS. 2A and 2B, two of the many tasks of the CPU 156 on a storage node 150 are to break up write data, and reassemble read data. When the system has determined that data is to be written, the authority 168 for that data is located as above. When the segment ID for data is already determined the request to write is forwarded to the non-volatile solid state storage 152 currently determined to be the host of the authority 168 determined from the segment. The host CPU 156 of the storage node 150, on which the non-volatile solid state storage 152 and corresponding authority 168 reside, then breaks up or shards the data and transmits the data out to various non-volatile solid state storage 152. The transmitted data is written as a data stripe in accordance with an erasure coding scheme. In some embodiments, data is requested to be pulled, and in other embodiments, data is pushed. In reverse, when data is read, the authority 168 for the segment ID containing the data is located as described above. The host CPU 156 of the storage node 150 on which the non-volatile solid state storage 152 and corresponding authority 168 reside requests the data from the non-volatile solid state storage and corresponding storage nodes pointed to by the authority. In some embodiments the data is read from flash storage as a data stripe. The host CPU 156 of storage node 150 then reassembles the read data, correcting any errors (if present) according to the appropriate erasure coding scheme, and forwards the reassembled data to the network. In further embodiments, some or all of these tasks can be handled in the non-volatile solid state storage 152. In some embodiments, the segment host requests the data be sent to storage node 150 by requesting pages from storage and then sending the data to the storage node making the original request.

In some systems, for example in UNIX-style file systems, data is handled with an index node or inode, which specifies a data structure that represents an object in a file system. The object could be a file or a directory, for example. Metadata may accompany the object, as attributes such as permission data and a creation timestamp, among other attributes. A segment number could be assigned to all or a portion of such an object in a file system. In other systems, data segments are handled with a segment number assigned elsewhere. For purposes of discussion, the unit of distribution is an entity, and an entity can be a file, a directory or a segment. That is, entities are units of data or metadata stored by a storage system. Entities are grouped into sets called authorities. Each authority has an authority owner, which is a storage node that has the exclusive right to update the entities in the authority. In other words, a storage node contains the authority, and that the authority, in turn, contains entities.

A segment is a logical container of data in accordance with some embodiments. A segment is an address space between medium address space and physical flash locations, i.e., the data segment number, are in this address space. Segments may also contain meta-data, which enable data redundancy to be restored (rewritten to different flash locations or devices) without the involvement of higher level software. In one embodiment, an internal format of a segment contains client data and medium mappings to determine the position of that data. Each data segment is protected, e.g., from memory and other failures, by breaking the segment into a number of data and parity shards, where applicable. The data and parity shards are distributed, i.e., striped, across non-volatile solid state storage 152 coupled to the host CPUs 156 (See FIGS. 2E and 2G) in accordance with an erasure coding scheme. Usage of the term segments refers to the container and its place in the address space of segments in some embodiments. Usage of the term stripe refers to the same set of shards as a segment and includes how the shards are distributed along with redundancy or parity information in accordance with some embodiments.

A series of address-space transformations takes place across an entire storage system. At the top are the directory entries (file names) which link to an inode. Inodes point into medium address space, where data is logically stored. Medium addresses may be mapped through a series of indirect mediums to spread the load of large files, or implement data services like deduplication or snapshots. Medium addresses may be mapped through a series of indirect mediums to spread the load of large files, or implement data services like deduplication or snapshots.

Segment addresses are then translated into physical flash locations. Physical flash locations have an address range bounded by the amount of flash in the system in accordance with some embodiments. Medium addresses and segment addresses are logical containers, and in some embodiments use a 128 bit or larger identifier so as to be practically infinite, with a likelihood of reuse calculated as longer than the expected life of the system. Addresses from logical containers are allocated in a hierarchical fashion in some embodiments. Initially, each non-volatile solid state storage unit 152 may be assigned a range of address space. Within this assigned range, the non-volatile solid state storage 152 is able to allocate addresses without synchronization with other non-volatile solid state storage 152.

Data and metadata is stored by a set of underlying storage layouts that are optimized for varying workload patterns and storage devices. These layouts incorporate multiple redundancy schemes, compression formats and index algorithms. Some of these layouts store information about authorities and authority masters, while others store file metadata and file data. The redundancy schemes include error correction codes that tolerate corrupted bits within a single storage device (such as a NAND flash chip), erasure codes that tolerate the failure of multiple storage nodes, and replication schemes that tolerate data center or regional failures. In some embodiments, low density parity check (LDPC) code is used within a single storage unit. Reed-Solomon encoding is used within a storage cluster, and mirroring is used within a storage grid in some embodiments. Metadata may be stored using an ordered log structured index (such as a Log Structured Merge Tree), and large data may not be stored in a log structured layout.

In order to maintain consistency across multiple copies of an entity, the storage nodes agree implicitly on two things through calculations: (1) the authority that contains the entity, and (2) the storage node that contains the authority. The assignment of entities to authorities can be done by pseudo randomly assigning entities to authorities, by splitting entities into ranges based upon an externally produced key, or by placing a single entity into each authority. Examples of pseudorandom schemes are linear hashing and the Replication Under Scalable Hashing (RUSH) family of hashes, including Controlled Replication Under Scalable Hashing (CRUSH). In some embodiments, pseudo-random assignment is utilized only for assigning authorities to nodes because the set of nodes can change. The set of authorities cannot change so any subjective function may be applied in these embodiments. Some placement schemes automatically place authorities on storage nodes, while other placement schemes rely on an explicit mapping of authorities to storage nodes. In some embodiments, a pseudorandom scheme is utilized to map from each authority to a set of candidate authority owners. A pseudorandom data distribution function related to CRUSH may assign authorities to storage nodes and create a list of where the authorities are assigned. Each storage node has a copy of the pseudorandom data distribution function, and can arrive at the same calculation for distributing, and later finding or locating an authority. Each of the pseudorandom schemes requires the reachable set of storage nodes as input in some embodiments in order to conclude the same target nodes. Once an entity has been placed in an authority, the entity may be stored on physical devices so that no expected failure will lead to unexpected data loss. In some embodiments, rebalancing algorithms attempt to store the copies of all entities within an authority in the same layout and on the same set of machines.

Examples of expected failures include device failures, stolen machines, datacenter fires, and regional disasters, such as nuclear or geological events. Different failures lead to different levels of acceptable data loss. In some embodiments, a stolen storage node impacts neither the security nor the reliability of the system, while depending on system configuration, a regional event could lead to no loss of data, a few seconds or minutes of lost updates, or even complete data loss.

In the embodiments, the placement of data for storage redundancy is independent of the placement of authorities for data consistency. In some embodiments, storage nodes that contain authorities do not contain any persistent storage. Instead, the storage nodes are connected to non-volatile solid state storage units that do not contain authorities. The communications interconnect between storage nodes and non-volatile solid state storage units consists of multiple communication technologies and has non-uniform performance and fault tolerance characteristics. In some embodiments, as mentioned above, non-volatile solid state storage units are connected to storage nodes via PCI express, storage nodes are connected together within a single chassis using Ethernet backplane, and chassis are connected together to form a storage cluster. Storage clusters are connected to clients using Ethernet or fiber channel in some embodiments. If multiple storage clusters are configured into a storage grid, the multiple storage clusters are connected using the Internet or other long-distance networking links, such as a "metro scale" link or private link that does not traverse the internet.

Authority owners have the exclusive right to modify entities, to migrate entities from one non-volatile solid state storage unit to another non-volatile solid state storage unit, and to add and remove copies of entities. This allows for maintaining the redundancy of the underlying data. When an authority owner fails, is going to be decommissioned, or is overloaded, the authority is transferred to a new storage node. Transient failures make it non-trivial to ensure that all non-faulty machines agree upon the new authority location. The ambiguity that arises due to transient failures can be achieved automatically by a consensus protocol such as Paxos, hot-warm failover schemes, via manual intervention by a remote system administrator, or by a local hardware administrator (such as by physically removing the failed machine from the cluster, or pressing a button on the failed machine). In some embodiments, a consensus protocol is used, and failover is automatic. If too many failures or replication events occur in too short a time period, the system goes into a self-preservation mode and halts replication and data movement activities until an administrator intervenes in accordance with some embodiments.

As authorities are transferred between storage nodes and authority owners update entities in their authorities, the system transfers messages between the storage nodes and non-volatile solid state storage units. With regard to persistent messages, messages that have different purposes are of different types. Depending on the type of the message, the system maintains different ordering and durability guarantees. As the persistent messages are being processed, the messages are temporarily stored in multiple durable and non-durable storage hardware technologies. In some embodiments, messages are stored in RAM, NVRAM and on NAND flash devices, and a variety of protocols are used in order to make efficient use of each storage medium. Latency-sensitive client requests may be persisted in replicated NVRAM, and then later NAND, while background rebalancing operations are persisted directly to NAND.

Persistent messages are persistently stored prior to being transmitted. This allows the system to continue to serve client requests despite failures and component replacement. Although many hardware components contain unique identifiers that are visible to system administrators, manufacturer, hardware supply chain and ongoing monitoring quality control infrastructure, applications running on top of the infrastructure address virtualize addresses. These virtualized addresses do not change over the lifetime of the storage system, regardless of component failures and replacements. This allows each component of the storage system to be replaced over time without reconfiguration or disruptions of client request processing, i.e., the system supports non-disruptive upgrades.

In some embodiments, the virtualized addresses are stored with sufficient redundancy. A continuous monitoring system correlates hardware and software status and the hardware identifiers. This allows detection and prediction of failures due to faulty components and manufacturing details. The monitoring system also enables the proactive transfer of authorities and entities away from impacted devices before failure occurs by removing the component from the critical path in some embodiments.

Figure 2C:
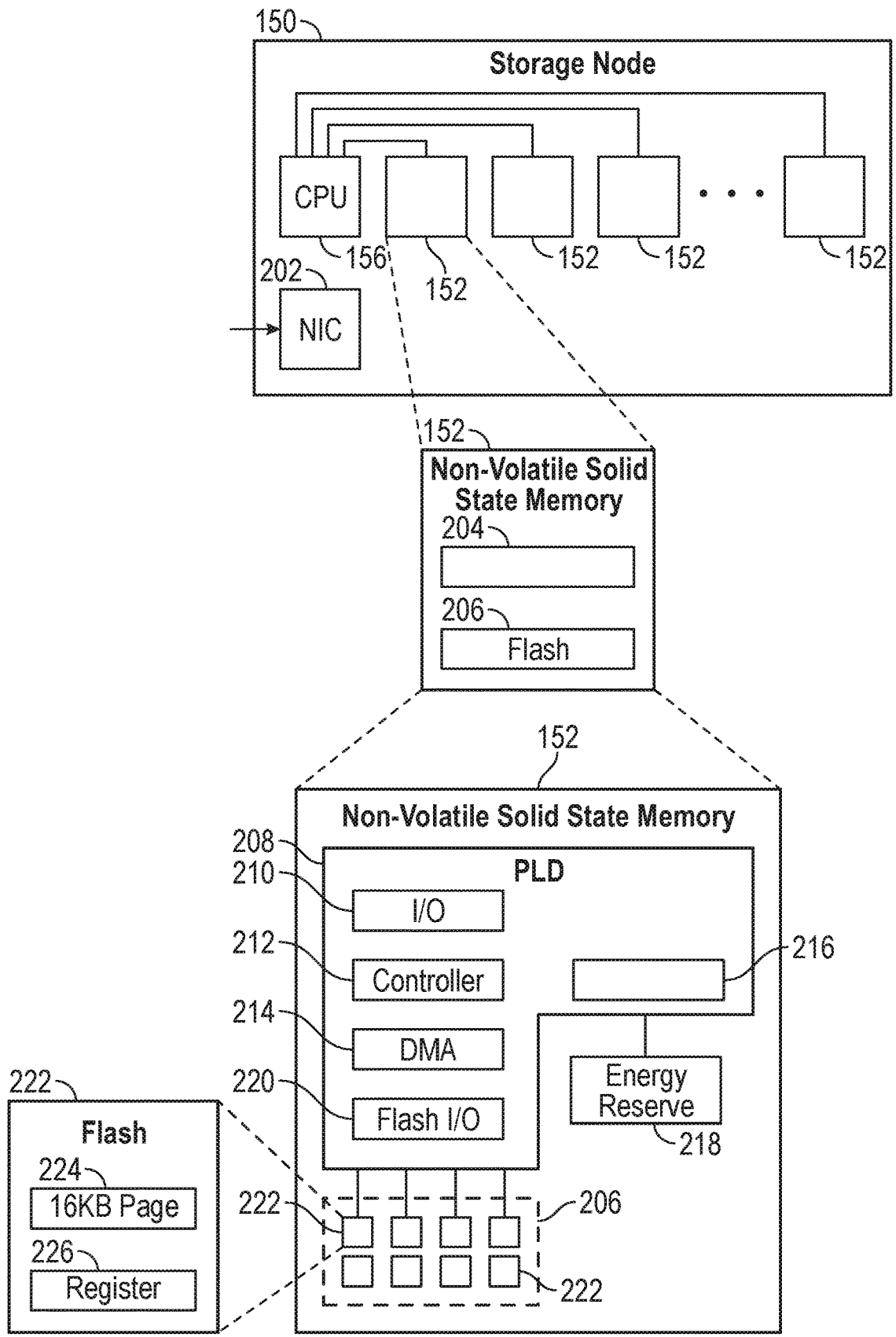
FIG. 2C is a multiple level block diagram, showing contents of a storage node and contents of one of the non-volatile solid state storage units in accordance with some embodiments.

FIG. 2C is a multiple level block diagram, showing contents of a storage node 150 and contents of a non-volatile solid state storage 152 of the storage node 150. Data is communicated to and from the storage node 150 by a network interface controller (NIC) 202 in some embodiments. Each storage node 150 has a CPU 156, and one or more non-volatile solid state storage 152, as discussed above. Moving down one level in FIG. 2C, each non-volatile solid state storage 152 has a relatively fast non-volatile solid state memory, such as nonvolatile random access memory (NVRAM) 204, and flash memory 206. In some embodiments, NVRAM 204 may be a component that does not require program/erase cycles (DRAM, MRAM, PCM), and can be a memory that can support being written vastly more often than the memory is read from. Moving down another level in FIG. 2C, the NVRAM 204 is implemented in one embodiment as high speed volatile memory, such as dynamic random access memory (DRAM) 216, backed up by energy reserve 218. Energy reserve 218 provides sufficient electrical power to keep the DRAM 216 powered long enough for contents to be transferred to the flash memory 206 in the event of power failure. In some embodiments, energy reserve 218 is a capacitor, super-capacitor, battery, or other device, that supplies a suitable supply of energy sufficient to enable the transfer of the contents of DRAM 216 to a stable storage medium in the case of power loss. The flash memory 206 is implemented as multiple flash dies 222, which may be referred to as packages of flash dies 222 or an array of flash dies 222. It should be appreciated that the flash dies 222 could be packaged in any number of ways, with a single die per package, multiple dies per package (i.e. multichip packages), in hybrid packages, as bare dies on a printed circuit board or other substrate, as encapsulated dies, etc. In the embodiment shown, the non-volatile solid state storage 152 has a controller 212 or other processor, and an input output (I/O) port 210 coupled to the controller 212. I/O port 210 is coupled to the CPU 156 and/or the network interface controller 202 of the flash storage node 150. Flash input output (I/O) port 220 is coupled to the flash dies 222, and a direct memory access unit (DMA) 214 is coupled to the controller 212, the DRAM 216 and the flash dies 222. In the embodiment shown, the I/O port 210, controller 212, DMA unit 214 and flash I/O port 220 are implemented on a programmable logic device (PLD) 208, e.g., a field programmable gate array (FPGA). In this embodiment, each flash die 222 has pages, organized as sixteen kB (kilobyte) pages 224, and a register 226 through which data can be written to or read from the flash die 222. In further embodiments, other types of solid-state memory are used in place of, or in addition to flash memory illustrated within flash die 222.

Storage clusters 161, in various embodiments as disclosed herein, can be contrasted with storage arrays in general. The storage nodes 150 are part of a collection that creates the storage cluster 161. Each storage node 150 owns a slice of data and computing required to provide the data. Multiple storage nodes 150 cooperate to store and retrieve the data. Storage memory or storage devices, as used in storage arrays in general, are less involved with processing and manipulating the data. Storage memory or storage devices in a storage array receive commands to read, write, or erase data. The storage memory or storage devices in a storage array are not aware of a larger system in which they are embedded, or what the data means. Storage memory or storage devices in storage arrays can include various types of storage memory, such as RAM, solid state drives, hard disk drives, etc. The storage units 152 described herein have multiple interfaces active simultaneously and serving multiple purposes. In some embodiments, some of the functionality of a storage node 150 is shifted into a storage unit 152, transforming the storage unit 152 into a combination of storage unit 152 and storage node 150. Placing computing (relative to storage data) into the storage unit 152 places this computing closer to the data itself. The various system embodiments have a hierarchy of storage node layers with different capabilities. By contrast, in a storage array, a controller owns and knows everything about all of the data that the controller manages in a shelf or storage devices. In a storage cluster 161, as described herein, multiple controllers in multiple storage units 152 and/or storage nodes 150 cooperate in various ways (e.g., for erasure coding, data sharding, metadata communication and redundancy, storage capacity expansion or contraction, data recovery, and so on).

Figure 2D:
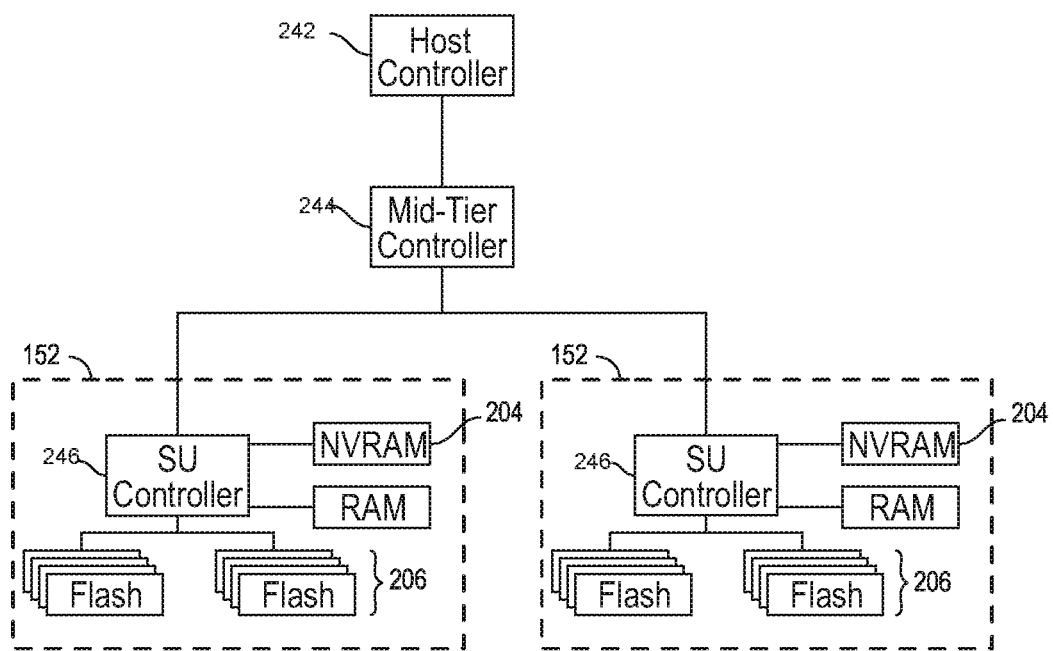
FIG. 2D shows a storage server environment, which uses embodiments of the storage nodes and storage units of FIGS. 1-3 in accordance with some embodiments.

FIG. 2D shows a storage server environment, which uses embodiments of the storage nodes 150 and storage units 152 of FIGS. 2A-C. In this version, each storage unit 152 has a processor such as controller 212 (see FIG. 2C), an FPGA (field programmable gate array), flash memory 206, and NVRAM 204 (which is super-capacitor backed DRAM 216, see FIGS. 2B and 2C) on a PCIe (peripheral component interconnect express) board in a chassis 138 (see FIG. 2A). The storage unit 152 may be implemented as a single board containing storage, and may be the largest tolerable failure domain inside the chassis. In some embodiments, up to two storage units 152 may fail and the device will continue with no data loss.

The physical storage is divided into named regions based on application usage in some embodiments. The NVRAM 204 is a contiguous block of reserved memory in the storage unit 152 DRAM 216, and is backed by NAND flash. NVRAM 204 is logically divided into multiple memory regions written for two as spool (e.g., spool_region). Space within the NVRAM 204 spools is managed by each authority 168 independently. Each device provides an amount of storage space to each authority 168. That authority 168 further manages lifetimes and allocations within that space. Examples of a spool include distributed transactions or notions. When the primary power to a storage unit 152 fails, onboard super-capacitors provide a short duration of power hold up. During this holdup interval, the contents of the NVRAM 204 are flushed to flash memory 206. On the next power-on, the contents of the NVRAM 204 are recovered from the flash memory 206.

As for the storage unit controller, the responsibility of the logical "controller" is distributed across each of the blades containing authorities 168. This distribution of logical control is shown in FIG. 2D as a host controller 242, mid-tier controller 244 and storage unit controller(s) 246. Management of the control plane and the storage plane are treated independently, although parts may be physically co-located on the same blade. Each authority 168 effectively serves as an independent controller. Each authority 168 provides its own data and metadata structures, its own background workers, and maintains its own lifecycle.

Figure 2E:
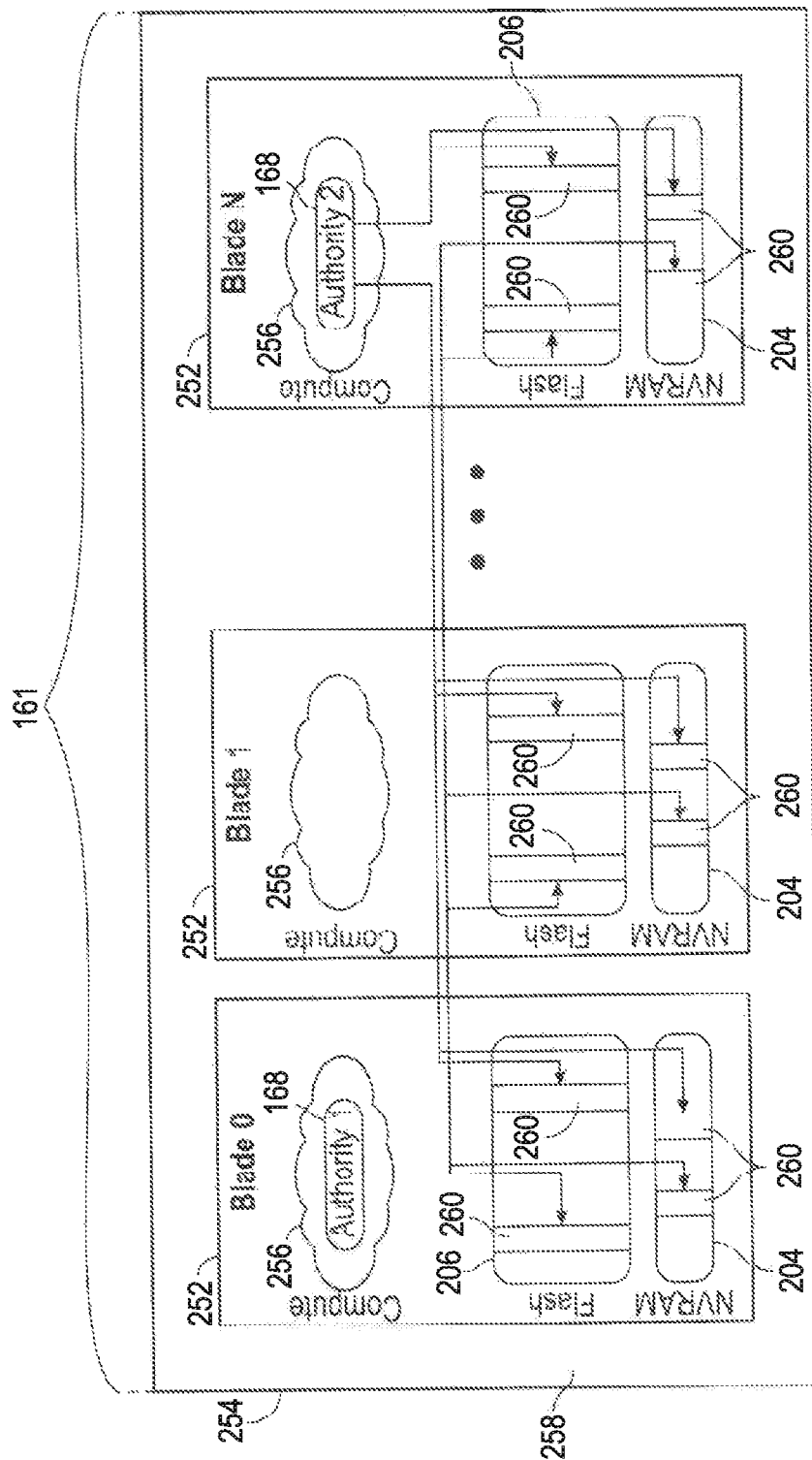
FIG. 2E is a blade hardware block diagram, showing a control plane, compute and storage planes, and authorities interacting with underlying physical resources, in accordance with some embodiments.

FIG. 2E is a blade 252 hardware block diagram, showing a control plane 254, compute and storage planes 256, 258, and authorities 168 interacting with underlying physical resources, using embodiments of the storage nodes 150 and storage units 152 of FIGS. 2A-C in the storage server environment of FIG. 2D. The control plane 254 is partitioned into a number of authorities 168 which can use the compute resources in the compute plane 256 to run on any of the blades 252. The storage plane 258 is partitioned into a set of devices, each of which provides access to flash 206 and NVRAM 204 resources.

In the compute and storage planes 256, 258 of FIG. 2E, the authorities 168 interact with the underlying physical resources (i.e., devices). From the point of view of an authority 168, its resources are striped over all of the physical devices. From the point of view of a device, it provides resources to all authorities 168, irrespective of where the authorities happen to run. Each authority 168 has allocated or has been allocated one or more partitions 260 of storage memory in the storage units 152, e.g. partitions 260 in flash memory 206 and NVRAM 204. Each authority 168 uses those allocated partitions 260 that belong to it, for writing or reading user data. Authorities can be associated with differing amounts of physical storage of the system. For example, one authority 168 could have a larger number of partitions 260 or larger sized partitions 260 in one or more storage units 152 than one or more other authorities 168.

Figure 2F:
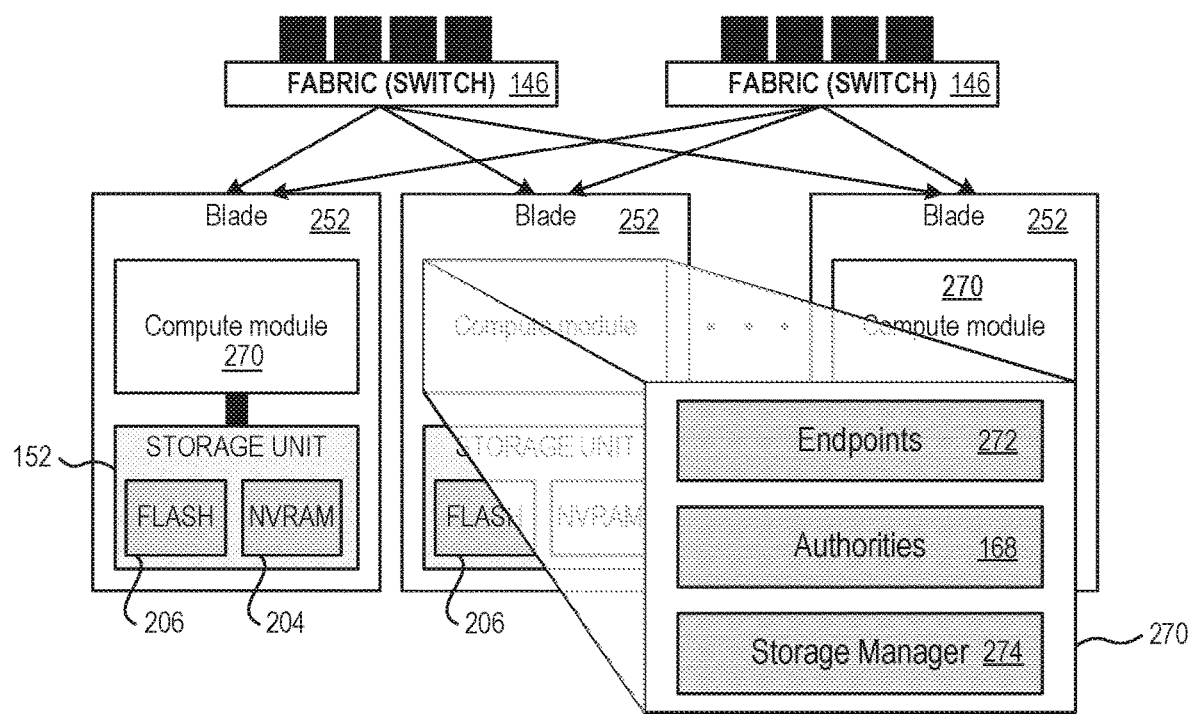
FIG. 2F depicts elasticity software layers in blades of a storage cluster, in accordance with some embodiments.

FIG. 2F depicts elasticity software layers in blades 252 of a storage cluster 161, in accordance with some embodiments. In the elasticity structure, elasticity software is symmetric, i.e., each blade's compute module 270 runs the three identical layers of processes depicted in FIG. 2F. Storage managers 274 execute read and write requests from other blades 252 for data and metadata stored in local storage unit 152 NVRAM 204 and flash 206. Authorities 168 fulfill client requests by issuing the necessary reads and writes to the blades 252 on whose storage units 152 the corresponding data or metadata resides. Endpoints 272 parse client connection requests received from switch fabric 146 supervisory software, relay the client connection requests to the authorities 168 responsible for fulfillment, and relay the authorities' 168 responses to clients. The symmetric three-layer structure enables the storage system's high degree of concurrency. Elasticity scales out efficiently and reliably in these embodiments. In addition, elasticity implements a unique scale-out technique that balances work evenly across all resources regardless of client access pattern, and maximizes concurrency by eliminating much of the need for inter-blade coordination that typically occurs with conventional distributed locking.

Still referring to FIG. 2F, authorities 168 running in the compute modules 270 of a blade 252 perform the internal operations required to fulfill client requests. One feature of elasticity is that authorities 168 are stateless, i.e., they cache active data and metadata in their own blades' 168 DRAMs for fast access, but the authorities store every update in their NVRAM 204 partitions on three separate blades 252 until the update has been written to flash 206. All the storage system writes to NVRAM 204 are in triplicate to partitions on three separate blades 252 in some embodiments. With triple-mirrored NVRAM 204 and persistent storage protected by parity and Reed-Solomon RAID checksums, the storage system can survive concurrent failure of two blades 252 with no loss of data, metadata, or access to either.

Because authorities 168 are stateless, they can migrate between blades 252. Each authority 168 has a unique identifier. NVRAM 204 and flash 206 partitions are associated with authorities' 168 identifiers, not with the blades 252 on which they are running in some. Thus, when an authority 168 migrates, the authority 168 continues to manage the same storage partitions from its new location. When a new blade 252 is installed in an embodiment of the storage cluster 161, the system automatically rebalances load by:
  Partitioning the new blade's 252 storage for use by the system's authorities 168,
  Migrating selected authorities 168 to the new blade 252,
  Starting endpoints 272 on the new blade 252 and including them in the switch fabric's 146 client connection distribution algorithm.

From their new locations, migrated authorities 168 persist the contents of their NVRAM 204 partitions on flash 206, process read and write requests from other authorities 168, and fulfill the client requests that endpoints 272 direct to them. Similarly, if a blade 252 fails or is removed, the system redistributes its authorities 168 among the system's remaining blades 252. The redistributed authorities 168 continue to perform their original functions from their new locations.

Figure 2G:
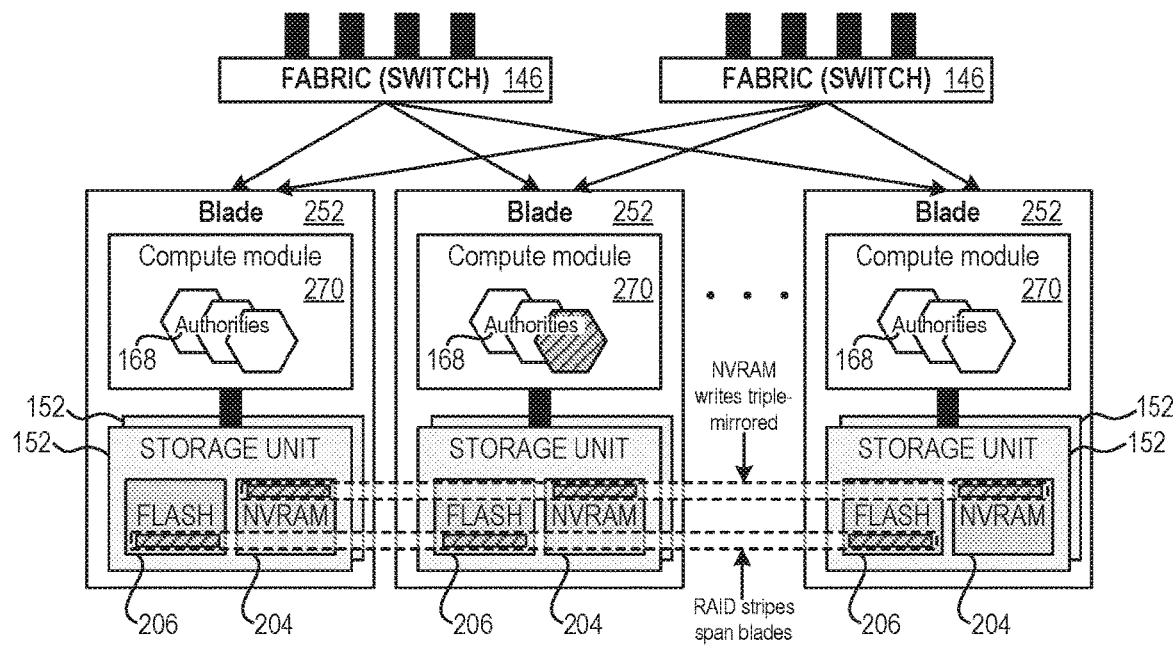
FIG. 2G depicts authorities and storage resources in blades of a storage cluster, in accordance with some embodiments.

FIG. 2G depicts authorities 168 and storage resources in blades 252 of a storage cluster, in accordance with some embodiments. Each authority 168 is exclusively responsible for a partition of the flash 206 and NVRAM 204 on each blade 252. The authority 168 manages the content and integrity of its partitions independently of other authorities 168. Authorities 168 compress incoming data and preserve it temporarily in their NVRAM 204 partitions, and then consolidate, RAID-protect, and persist the data in segments of the storage in their flash 206 partitions. As the authorities 168 write data to flash 206, storage managers 274 perform the necessary flash translation to optimize write performance and maximize media longevity. In the background, authorities 168 "garbage collect," or reclaim space occupied by data that clients have made obsolete by overwriting the data. It should be appreciated that since authorities' 168 partitions are disjoint, there is no need for distributed locking to execute client and writes or to perform background functions.

The embodiments described herein may utilize various software, communication and/or networking protocols. In addition, the configuration of the hardware and/or software may be adjusted to accommodate various protocols. For example, the embodiments may utilize Active Directory, which is a database based system that provides authentication, directory, policy, and other services in a WINDOWS™ environment. In these embodiments, LDAP (Lightweight Directory Access Protocol) is one example application protocol for querying and modifying items in directory service providers such as Active Directory. In some embodiments, a network lock manager (NLM) is utilized as a facility that works in cooperation with the Network File System (NFS) to provide a System V style of advisory file and record locking over a network. The Server Message Block (SMB) protocol, one version of which is also known as Common Internet File System (CIFS), may be integrated with the storage systems discussed herein. SMP operates as an application-layer network protocol typically used for providing shared access to files, printers, and serial ports and miscellaneous communications between nodes on a network. SMB also provides an authenticated inter-process communication mechanism. AMAZON™ S3 (Simple Storage Service) is a web service offered by Amazon Web Services, and the systems described herein may interface with Amazon S3 through web services interfaces (REST (representational state transfer), SOAP (simple object access protocol), and BitTorrent). A RESTful API (application programming interface) breaks down a transaction to create a series of small modules. Each module addresses a particular underlying part of the transaction. The control or permissions provided with these embodiments, especially for object data, may include utilization of an access control list (ACL). The ACL is a list of permissions attached to an object and the ACL specifies which users or system processes are granted access to objects, as well as what operations are allowed on given objects. The systems may utilize Internet Protocol version 6 (IPv6), as well as IPv4, for the communications protocol that provides an identification and location system for computers on networks and routes traffic across the Internet. The routing of packets between networked systems may include Equal-cost multi-path routing (ECMP), which is a routing strategy where next-hop packet forwarding to a single destination can occur over multiple "best paths" which tie for top place in routing metric calculations. Multi-path routing can be used in conjunction with most routing protocols, because it is a per-hop decision limited to a single router. The software may support Multi-tenancy, which is an architecture in which a single instance of a software application serves multiple customers. Each customer may be referred to as a tenant. Tenants may be given the ability to customize some parts of the application, but may not customize the application's code, in some embodiments. The embodiments may maintain audit logs. An audit log is a document that records an event in a computing system. In addition to documenting what resources were accessed, audit log entries typically include destination and source addresses, a timestamp, and user login information for compliance with various regulations. The embodiments may support various key management policies, such as encryption key rotation. In addition, the system may support dynamic root passwords or some variation dynamically changing passwords.

Figure 3A:
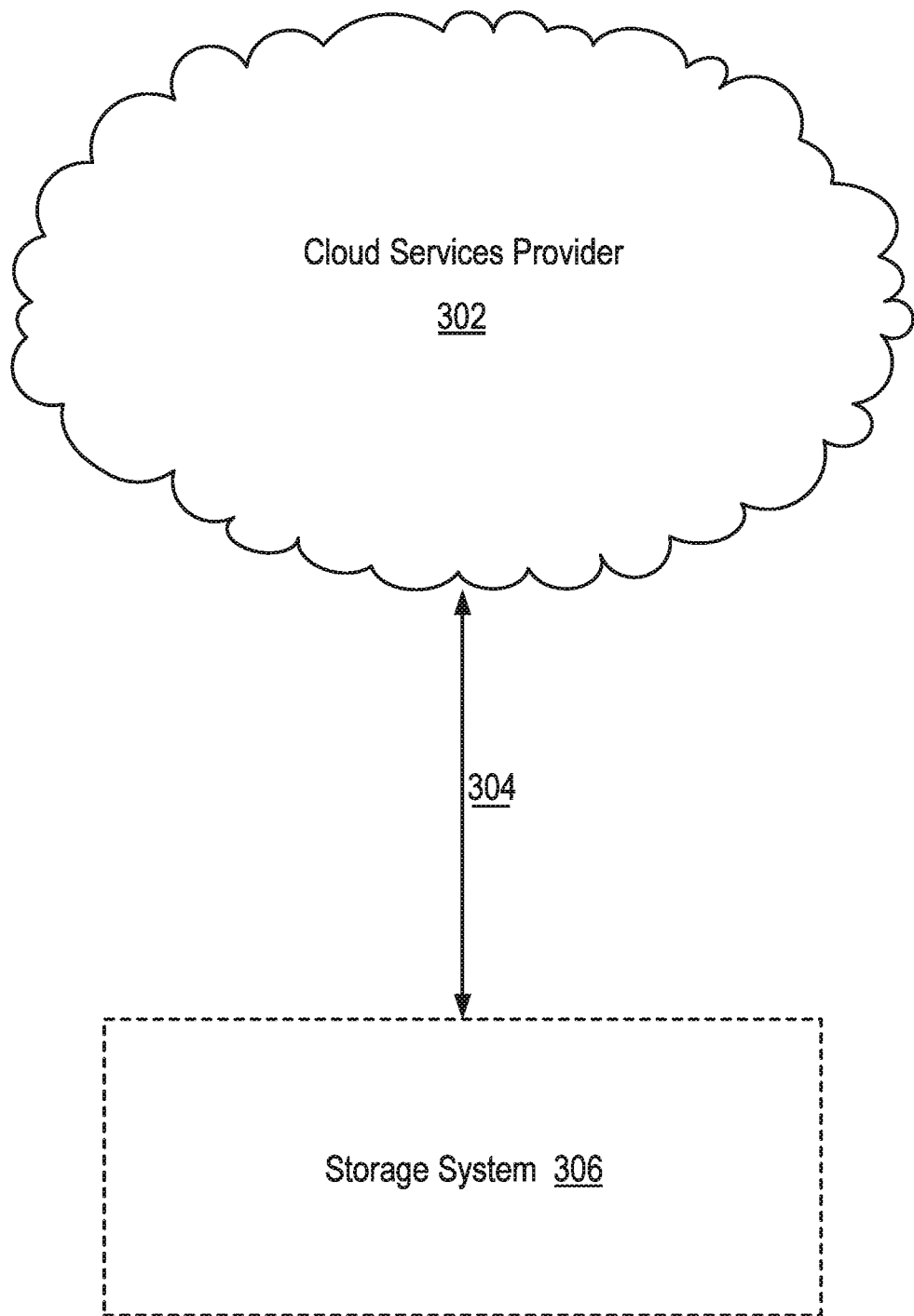
FIG. 3A sets forth a diagram of a storage system that is coupled for data communications with a cloud services provider in accordance with some embodiments of the present disclosure.

FIG. 3A sets forth a diagram of a storage system 306 that is coupled for data communications with a cloud services provider 302 in accordance with some embodiments of the present disclosure. Although depicted in less detail, the storage system 306 depicted in FIG. 3A may be similar to the storage systems described above with reference to FIGS. 1A-1D and FIGS. 2A-2G. In some embodiments, the storage system 306 depicted in FIG. 3A may be embodied as a storage system that includes imbalanced active/active controllers, as a storage system that includes balanced active/active controllers, as a storage system that includes active/active controllers where less than all of each controller's resources are utilized such that each controller has reserve resources that may be used to support failover, as a storage system that includes fully active/active controllers, as a storage system that includes dataset-segregated controllers, as a storage system that includes dual-layer architectures with front-end controllers and back-end integrated storage controllers, as a storage system that includes scale-out clusters of dual-controller arrays, as well as combinations of such embodiments.

In the example depicted in FIG. 3A, the storage system 306 is coupled to the cloud services provider 302 via a data communications link 304. The data communications link 304 may be embodied as a dedicated data communications link, as a data communications pathway that is provided through the use of one or data communications networks such as a wide area network ('WAN') or local area network ('LAN'), or as some other mechanism capable of transporting digital information between the storage system 306 and the cloud services provider 302. Such a data communications link 304 may be fully wired, fully wireless, or some aggregation of wired and wireless data communications pathways. In such an example, digital information may be exchanged between the storage system 306 and the cloud services provider 302 via the data communications link 304 using one or more data communications protocols. For example, digital information may be exchanged between the storage system 306 and the cloud services provider 302 via the data communications link 304 using the handheld device transfer protocol ('HDTP'), hypertext transfer protocol ('HTTP'), internet protocol ('IP'), real-time transfer protocol ('RTP'), transmission control protocol ('TCP'), user datagram protocol ('UDP'), wireless application protocol ('WAP'), or other protocol.

The cloud services provider 302 depicted in FIG. 3A may be embodied, for example, as a system and computing environment that provides services to users of the cloud services provider 302 through the sharing of computing resources via the data communications link 304. The cloud services provider 302 may provide on-demand access to a shared pool of configurable computing resources such as computer networks, servers, storage, applications and services, and so on. The shared pool of configurable resources may be rapidly provisioned and released to a user of the cloud services provider 302 with minimal management effort. Generally, the user of the cloud services provider 302 is unaware of the exact computing resources utilized by the cloud services provider 302 to provide the services. Although in many cases such a cloud services provider 302 may be accessible via the Internet, readers of skill in the art will recognize that any system that abstracts the use of shared resources to provide services to a user through any data communications link may be considered a cloud services provider 302.

In the example depicted in FIG. 3A, the cloud services provider 302 may be configured to provide a variety of services to the storage system 306 and users of the storage system 306 through the implementation of various service models. For example, the cloud services provider 302 may be configured to provide services to the storage system 306 and users of the storage system 306 through the implementation of an infrastructure as a service ('IaaS') service model where the cloud services provider 302 offers computing infrastructure such as virtual machines and other resources as a service to subscribers. In addition, the cloud services provider 302 may be configured to provide services to the storage system 306 and users of the storage system 306 through the implementation of a platform as a service ('PaaS') service model where the cloud services provider 302 offers a development environment to application developers. Such a development environment may include, for example, an operating system, programming-language execution environment, database, web server, or other components that may be utilized by application developers to develop and run software solutions on a cloud platform. Furthermore, the cloud services provider 302 may be configured to provide services to the storage system 306 and users of the storage system 306 through the implementation of a software as a service ('SaaS') service model where the cloud services provider 302 offers application software, databases, as well as the platforms that are used to run the applications to the storage system 306 and users of the storage system 306, providing the storage system 306 and users of the storage system 306 with on-demand software and eliminating the need to install and run the application on local computers, which may simplify maintenance and support of the application. The cloud services provider 302 may be further configured to provide services to the storage system 306 and users of the storage system 306 through the implementation of an authentication as a service ('AaaS') service model where the cloud services provider 302 offers authentication services that can be used to secure access to applications, data sources, or other resources. The cloud services provider 302 may also be configured to provide services to the storage system 306 and users of the storage system 306 through the implementation of a storage as a service service model where the cloud services provider 302 offers access to its storage infrastructure for use by the storage system 306 and users of the storage system 306. Readers will appreciate that the cloud services provider 302 may be configured to provide additional services to the storage system 306 and users of the storage system 306 through the implementation of additional service models, as the service models described above are included only for explanatory purposes and in no way represent a limitation of the services that may be offered by the cloud services provider 302 or a limitation as to the service models that may be implemented by the cloud services provider 302.

In the example depicted in FIG. 3A, the cloud services provider 302 may be embodied, for example, as a private cloud, as a public cloud, or as a combination of a private cloud and public cloud. In an embodiment in which the cloud services provider 302 is embodied as a private cloud, the cloud services provider 302 may be dedicated to providing services to a single organization rather than providing services to multiple organizations. In an embodiment where the cloud services provider 302 is embodied as a public cloud, the cloud services provider 302 may provide services to multiple organizations. Public cloud and private cloud deployment models may differ and may come with various advantages and disadvantages. For example, because a public cloud deployment involves the sharing of a computing infrastructure across different organization, such a deployment may not be ideal for organizations with security concerns, mission-critical workloads, uptime requirements demands, and so on. While a private cloud deployment can address some of these issues, a private cloud deployment may require on-premises staff to manage the private cloud. In still alternative embodiments, the cloud services provider 302 may be embodied as a mix of a private and public cloud services with a hybrid cloud deployment.

Although not explicitly depicted in FIG. 3A, readers will appreciate that additional hardware components and additional software components may be necessary to facilitate the delivery of cloud services to the storage system 306 and users of the storage system 306. For example, the storage system 306 may be coupled to (or even include) a cloud storage gateway. Such a cloud storage gateway may be embodied, for example, as hardware-based or software-based appliance that is located on premise with the storage system 306. Such a cloud storage gateway may operate as a bridge between local applications that are executing on the storage array 306 and remote, cloud-based storage that is utilized by the storage array 306. Through the use of a cloud storage gateway, organizations may move primary iSCSI or NAS to the cloud services provider 302, thereby enabling the organization to save space on their on-premises storage systems. Such a cloud storage gateway may be configured to emulate a disk array, a block-based device, a file server, or other storage system that can translate the SCSI commands, file server commands, or other appropriate command into REST-space protocols that facilitate communications with the cloud services provider 302.

In order to enable the storage system 306 and users of the storage system 306 to make use of the services provided by the cloud services provider 302, a cloud migration process may take place during which data, applications, or other elements from an organization's local systems (or even from another cloud environment) are moved to the cloud services provider 302. In order to successfully migrate data, applications, or other elements to the cloud services provider's 302 environment, middleware such as a cloud migration tool may be utilized to bridge gaps between the cloud services provider's 302 environment and an organization's environment. Such cloud migration tools may also be configured to address potentially high network costs and long transfer times associated with migrating large volumes of data to the cloud services provider 302, as well as addressing security concerns associated with sensitive data to the cloud services provider 302 over data communications networks. In order to further enable the storage system 306 and users of the storage system 306 to make use of the services provided by the cloud services provider 302, a cloud orchestrator may also be used to arrange and coordinate automated tasks in pursuit of creating a consolidated process or workflow. Such a cloud orchestrator may perform tasks such as configuring various components, whether those components are cloud components or on-premises components, as well as managing the interconnections between such components. The cloud orchestrator can simplify the inter-component communication and connections to ensure that links are correctly configured and maintained.

In the example depicted in FIG. 3A, and as described briefly above, the cloud services provider 302 may be configured to provide services to the storage system 306 and users of the storage system 306 through the usage of a SaaS service model where the cloud services provider 302 offers application software, databases, as well as the platforms that are used to run the applications to the storage system 306 and users of the storage system 306, providing the storage system 306 and users of the storage system 306 with on-demand software and eliminating the need to install and run the application on local computers, which may simplify maintenance and support of the application. Such applications may take many forms in accordance with various embodiments of the present disclosure. For example, the cloud services provider 302 may be configured to provide access to data analytics applications to the storage system 306 and users of the storage system 306. Such data analytics applications may be configured, for example, to receive telemetry data phoned home by the storage system 306. Such telemetry data may describe various operating characteristics of the storage system 306 and may be analyzed, for example, to determine the health of the storage system 306, to identify workloads that are executing on the storage system 306, to predict when the storage system 306 will run out of various resources, to recommend configuration changes, hardware or software upgrades, workflow migrations, or other actions that may improve the operation of the storage system 306.

The cloud services provider 302 may also be configured to provide access to virtualized computing environments to the storage system 306 and users of the storage system 306. Such virtualized computing environments may be embodied, for example, as a virtual machine or other virtualized computer hardware platforms, virtual storage devices, virtualized computer network resources, and so on. Examples of such virtualized environments can include virtual machines that are created to emulate an actual computer, virtualized desktop environments that separate a logical desktop from a physical machine, virtualized file systems that allow uniform access to different types of concrete file systems, and many others.

Figure 3B:
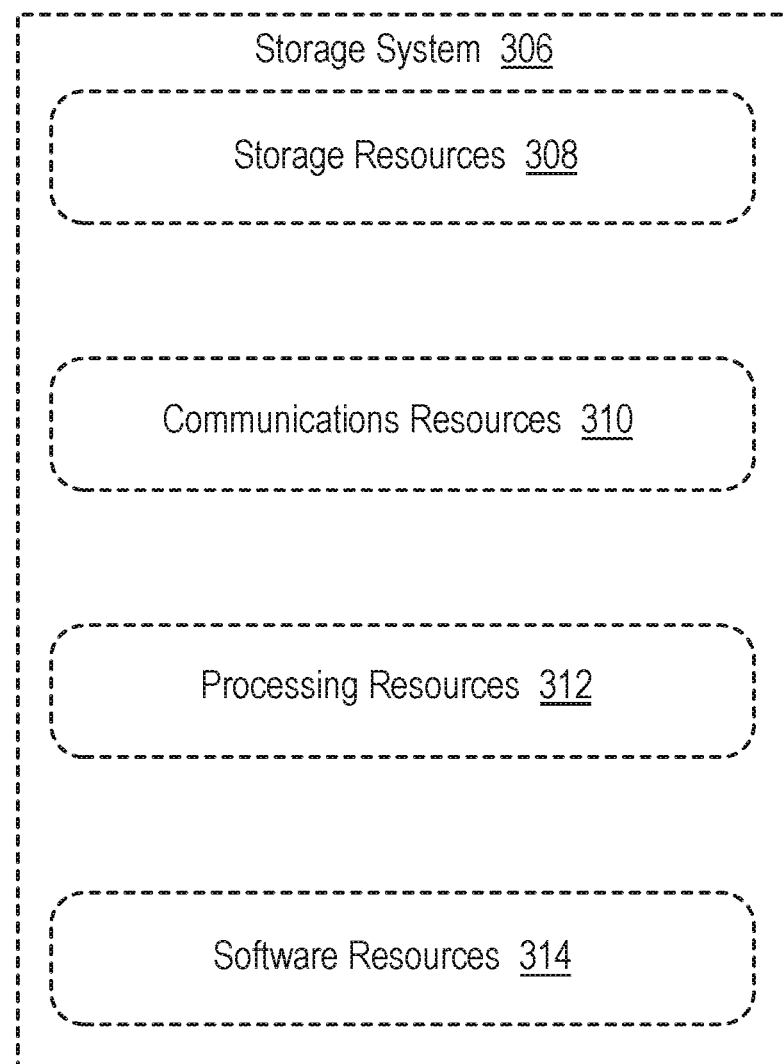
FIG. 3B sets forth a diagram of a storage system in accordance with some embodiments of the present disclosure.

For further explanation, FIG. 3B sets forth a diagram of a storage system 306 in accordance with some embodiments of the present disclosure. Although depicted in less detail, the storage system 306 depicted in FIG. 3B may be similar to the storage systems described above with reference to FIGS. 1A-1D and FIGS. 2A-2G as the storage system may include many of the components described above.

The storage system 306 depicted in FIG. 3B may include storage resources 308, which may be embodied in many forms. For example, in some embodiments the storage resources 308 can include nano-RAM or another form of nonvolatile random access memory that utilizes carbon nanotubes deposited on a substrate. In some embodiments, the storage resources 308 may include 3D crosspoint non-volatile memory in which bit storage is based on a change of bulk resistance, in conjunction with a stackable cross-gridded data access array. In some embodiments, the storage resources 308 may include flash memory, including single-level cell ('SLC') NAND flash, multi-level cell ('MLC') NAND flash, triple-level cell ('TLC') NAND flash, quad-level cell ('QLC') NAND flash, and others. In some embodiments, the storage resources 308 may include non-volatile magnetoresistive random-access memory ('MRAM'), including spin transfer torque ('STT') MRAM, in which data is stored through the use of magnetic storage elements. In some embodiments, the example storage resources 308 may include non-volatile phase-change memory ('PCM') that may have the ability to hold multiple bits in a single cell as cells can achieve a number of distinct intermediary states. In some embodiments, the storage resources 308 may include quantum memory that allows for the storage and retrieval of photonic quantum information. In some embodiments, the example storage resources 308 may include resistive random-access memory ('ReRAM') in which data is stored by changing the resistance across a dielectric solid-state material. In some embodiments, the storage resources 308 may include storage class memory ('SCM') in which solid-state nonvolatile memory may be manufactured at a high density using some combination of sub-lithographic patterning techniques, multiple bits per cell, multiple layers of devices, and so on. Readers will appreciate that other forms of computer memories and storage devices may be utilized by the storage systems described above, including DRAM, SRAM, EEPROM, universal memory, and many others. The storage resources 308 depicted in FIG. 3A may be embodied in a variety of form factors, including but not limited to, dual in-line memory modules ('DIMMs'), non-volatile dual in-line memory modules ('NVDIMMs'), M.2, U.2, and others.

The example storage system 306 depicted in FIG. 3B may implement a variety of storage architectures. For example, storage systems in accordance with some embodiments of the present disclosure may utilize block storage where data is stored in blocks, and each block essentially acts as an individual hard drive. Storage systems in accordance with some embodiments of the present disclosure may utilize object storage, where data is managed as objects. Each object may include the data itself, a variable amount of metadata, and a globally unique identifier, where object storage can be implemented at multiple levels (e.g., device level, system level, interface level). Storage systems in accordance with some embodiments of the present disclosure utilize file storage in which data is stored in a hierarchical structure. Such data may be saved in files and folders, and presented to both the system storing it and the system retrieving it in the same format.

The example storage system 306 depicted in FIG. 3B may be embodied as a storage system in which additional storage resources can be added through the use of a scale-up model, additional storage resources can be added through the use of a scale-out model, or through some combination thereof. In a scale-up model, additional storage may be added by adding additional storage devices. In a scale-out model, however, additional storage nodes may be added to a cluster of storage nodes, where such storage nodes can include additional processing resources, additional networking resources, and so on.

The storage system 306 depicted in FIG. 3B also includes communications resources 310 that may be useful in facilitating data communications between components within the storage system 306, as well as data communications between the storage system 306 and computing devices that are outside of the storage system 306. The communications resources 310 may be configured to utilize a variety of different protocols and data communication fabrics to facilitate data communications between components within the storage systems as well as computing devices that are outside of the storage system. For example, the communications resources 310 can include fibre channel ('FC') technologies such as FC fabrics and FC protocols that can transport SCSI commands over FC networks. The communications resources 310 can also include FC over ethernet ('FCoE') technologies through which FC frames are encapsulated and transmitted over Ethernet networks. The communications resources 310 can also include InfiniBand ('IB') technologies in which a switched fabric topology is utilized to facilitate transmissions between channel adapters. The communications resources 310 can also include NVM Express ('NVMe') technologies and NVMe over fabrics ('NVMeoF') technologies through which non-volatile storage media attached via a PCI express ('PCIe') bus may be accessed. The communications resources 310 can also include mechanisms for accessing storage resources 308 within the storage system 306 utilizing serial attached SCSI ('SAS'), serial ATA ('SATA') bus interfaces for connecting storage resources 308 within the storage system 306 to host bus adapters within the storage system 306, internet small computer systems interface ('iSCSI') technologies to provide block-level access to storage resources 308 within the storage system 306, and other communications resources that that may be useful in facilitating data communications between components within the storage system 306, as well as data communications between the storage system 306 and computing devices that are outside of the storage system 306.

The storage system 306 depicted in FIG. 3B also includes processing resources 312 that may be useful in useful in executing computer program instructions and performing other computational tasks within the storage system 306. The processing resources 312 may include one or more application-specific integrated circuits ('ASICs') that are customized for some particular purpose as well as one or more central processing units ('CPUs'). The processing resources 312 may also include one or more digital signal processors ('DSPs'), one or more field-programmable gate arrays ('FPGAs'), one or more systems on a chip ('SoCs'), or other form of processing resources 312. The storage system 306 may utilize the storage resources 312 to perform a variety of tasks including, but not limited to, supporting the execution of software resources 314 that will be described in greater detail below.

The storage system 306 depicted in FIG. 3B also includes software resources 314 that, when executed by processing resources 312 within the storage system 306, may perform various tasks. The software resources 314 may include, for example, one or more modules of computer program instructions that when executed by processing resources 312 within the storage system 306 are useful in carrying out various data protection techniques to preserve the integrity of data that is stored within the storage systems. Readers will appreciate that such data protection techniques may be carried out, for example, by system software executing on computer hardware within the storage system, by a cloud services provider, or in other ways. Such data protection techniques can include, for example, data archiving techniques that cause data that is no longer actively used to be moved to a separate storage device or separate storage system for long-term retention, data backup techniques through which data stored in the storage system may be copied and stored in a distinct location to avoid data loss in the event of equipment failure or some other form of catastrophe with the storage system, data replication techniques through which data stored in the storage system is replicated to another storage system such that the data may be accessible via multiple storage systems, data snapshotting techniques through which the state of data within the storage system is captured at various points in time, data and database cloning techniques through which duplicate copies of data and databases may be created, and other data protection techniques. Through the use of such data protection techniques, business continuity and disaster recovery objectives may be met as a failure of the storage system may not result in the loss of data stored in the storage system.

The software resources 314 may also include software that is useful in implementing software-defined storage ('SDS'). In such an example, the software resources 314 may include one or more modules of computer program instructions that, when executed, are useful in policy-based provisioning and management of data storage that is independent of the underlying hardware. Such software resources 314 may be useful in implementing storage virtualization to separate the storage hardware from the software that manages the storage hardware.

The software resources 314 may also include software that is useful in facilitating and optimizing I/O operations that are directed to the storage resources 308 in the storage system 306. For example, the software resources 314 may include software modules that perform carry out various data reduction techniques such as, for example, data compression, data deduplication, and others. The software resources 314 may include software modules that intelligently group together I/O operations to facilitate better usage of the underlying storage resource 308, software modules that perform data migration operations to migrate from within a storage system, as well as software modules that perform other functions. Such software resources 314 may be embodied as one or more software containers or in many other ways.

Readers will appreciate that the various components depicted in FIG. 3B may be grouped into one or more optimized computing packages as converged infrastructures. Such converged infrastructures may include pools of computers, storage and networking resources that can be shared by multiple applications and managed in a collective manner using policy-driven processes. Such converged infrastructures may minimize compatibility issues between various components within the storage system 306 while also reducing various costs associated with the establishment and operation of the storage system 306. Such converged infrastructures may be implemented with a converged infrastructure reference architecture, with standalone appliances, with a software driven hyper-converged approach, or in other ways.

Readers will appreciate that the storage system 306 depicted in FIG. 3B may be useful for supporting various types of software applications. For example, the storage system 306 may be useful in supporting artificial intelligence applications, database applications, DevOps projects, electronic design automation tools, event-driven software applications, high performance computing applications, simulation applications, high-speed data capture and analysis applications, machine learning applications, media production applications, media serving applications, picture archiving and communication systems ('PACS') applications, software development applications, and many other types of applications by providing storage resources to such applications.

Figure 4:
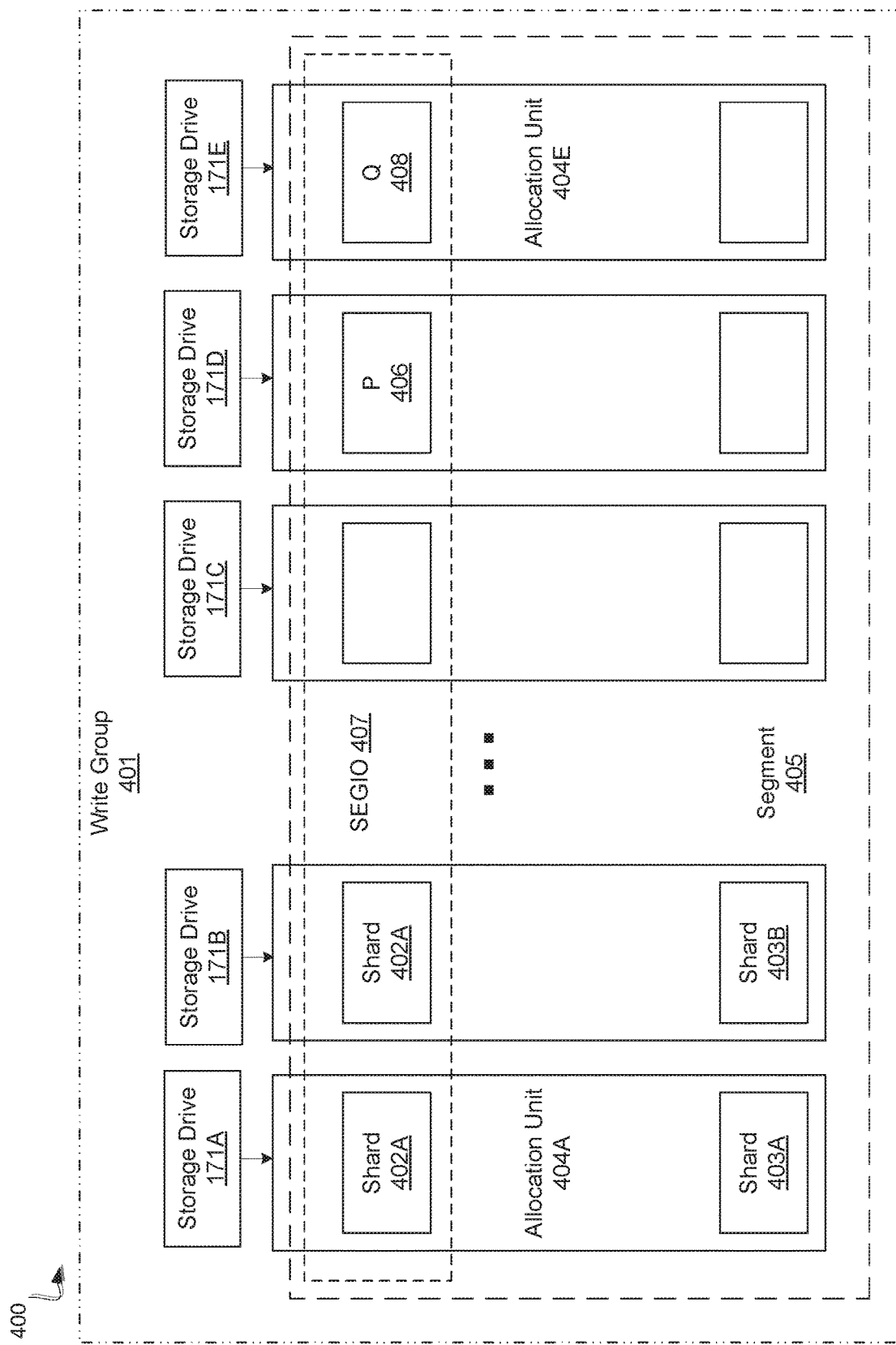
FIG. 4 illustrates an example system for RAID in a direct-mapped storage system, in accordance with some implementations.

FIG. 4 illustrates an example system 400 for RAID in a direct-mapped storage system, in accordance with some implementations. In one embodiment, system 400 may include storage drives 171A-E. Storage drives 171A-E may be operatively coupled to one or more storage controllers. In one embodiment, storage drives 171A-E include a direct-mapped solid state drive (SSD) storage portion. In other embodiment, storage drives 171A-E also include a fast-write portion to journal data to be written to the direct-mapped SSD portions. In one embodiment, the fast-write portion is an NVRAM portion. The direct-mapped SSD portion and the NVRAM portion may be separately addressable. The NVRAM portion may be smaller than the direct-mapped SSD portion. Storage drives 171A-E may be organized into write groups (e.g., write group 401). Write groups may RAID-protect and write data in segments (e.g., SEGIO 407) that consist of allocation units (e.g., allocation units 404A, 404E) located on a subset of the storage drives 171A-E within a write group.

In one embodiment, SSDs present disk-like LBA spaces of numbered sectors, typically in the range of 512 bytes to 8192 bytes, to storage controllers. The controllers may manage the SSD's LBA space in relatively large blocks (for example, 1-megabyte to 64-megabytes) of logically contiguous LBAs called allocation units (AUs). Storage controllers may align AUs with each SSD's internal storage organization to optimize performance and minimize media wear.

In one embodiment storage controllers may allocate physical storage in segments (e.g., SEGIO 407). A segment may consist of several AUs, each on a different SSD in the same write group. An AU in a segment may be located on any AU boundary in its SSD's LBA space. Storage controllers may determine the size of a segment when they allocate it based on (a) whether it will contain data or metadata, and (b) the number of SSDs in the selected write group. In one embodiment, a data segment consists of eight to sixteen AUs, and might vary from segment to segment based on redundancy or performance requirements, or available storage devices and storage device layout within the storage system.

In one embodiment, to allocate a segment, a storage controller selects a write group, and the SSDs in the write group that will contribute AUs. Write group and SSD selections may be quasi-random. In another embodiment, for long-term I/O and media wear balance, selections may be slightly biased in favor of newer SSDs, less frequently used SSDs, and/or SSDs that contain more free AUs. In another embodiment, for segments expected to remain untouched for longer periods of time, selection might be biased toward older SSDs or regions of SSDs that are older and have less remaining expected lifespan. To ensure that SSDs are available in order to allow for recovery and rebuilds from failed devices, segments may be limited to one or two fewer AUs than the number of SSDs in the write group at allocation time.

In one embodiment, storage controllers may designate an AU in a segment as a column of, for example, 1-megabyte shards (e.g., shards 402A-E). Corresponding shards in each of a segment's AUs may collectively be called a SEGIO (e.g., SEGIO 407). SEGIO 407 may be the unit in which storage controllers pack data or metadata before writing it to flash, and over which they calculate RAID-3D checksums. In one embodiment, RAID checksums (erasure codes) may be rotated (e.g., occupy different shard positions in each of a segment's SEGIOs).

In one embodiment, storage controllers designate a shard as a column of logical pages that align with SSD flash pages, the units in which SSDs write and ECC-protect data internally. In one embodiment, logical pages of 4 kilobytes may be used. In other embodiments, smaller or larger logical pages may be utilized. Storage controllers may calculate independent RAID-3D parity over each set of corresponding logical pages in a SEGIO. Advantageously, when an uncorrectable read error occurs, storage controllers may rebuild the unreadable logical page from erasure codes stored elsewhere in a SEGIO, either elsewhere within the same shard to cover single-page read errors, or from shards on other devices.

In one embodiment, to optimize read time, arrays pack data and metadata into shard buffer logical pages in an order that minimizes large block fragmentation. Packing order may not affect write performance because arrays may write entire shards. Storage controllers may calculate and store a page checksum (e.g., P 406 and Q 408) based on the data written to the storage drives. Checksums may be initialized, with a corresponding page offset in the shard and with the monotonically increasing segment number. In one embodiment, when a storage controller reads a logical page, it recalculates its checksum and compares the result with the stored value to verify both the content and the source of the page.

In one embodiment, storage controllers organize data in content blocks (cblocks) for storage on flash. Storage controllers may split large writes into multiple cblocks based on size and alignment; in one embodiment, a cblock may contain up to 64 kilobytes. In one embodiment, before storing data, storage controllers may reduce (compress) data by: eliminating sectors whose entire contents consist of repeated zeros, repeated byte values, or other simple patterns (for example, repeated single bytes or words, known patterns such as database free blocks, etc.); deduplicating, by eliminating sequences of sectors that are identical to already-stored data; and/or compressing data that is neither a simple pattern nor a duplicate of already-stored data using one of a variety of compression algorithms.

In one embodiment, storage controllers may pack reduced cblocks into logical page buffers in approximate order of arrival, effectively creating a log of the data written by hosts or by the storage system. In another embodiment, storage controllers may pack reduced cblocks into logical page buffers in (or substantially similar to) the order in which the storage controllers generate the data to be stored (e.g., write to a backing store). They may pack cblocks densely—each one begins where the preceding one ends. Advantageously, this may mean that little space is wasted due to "rounding up" to 4, 8, 16, 512 kilobyte, or other boundaries. Dense packing uses media more efficiently than alternative operations that map LBAs directly to physical storage, or that locate data based on its content. Moreover, it may contribute to longer media life by reducing the total accumulated data written to storage media such as flash, which can degrade as it is written.

Figure 5:
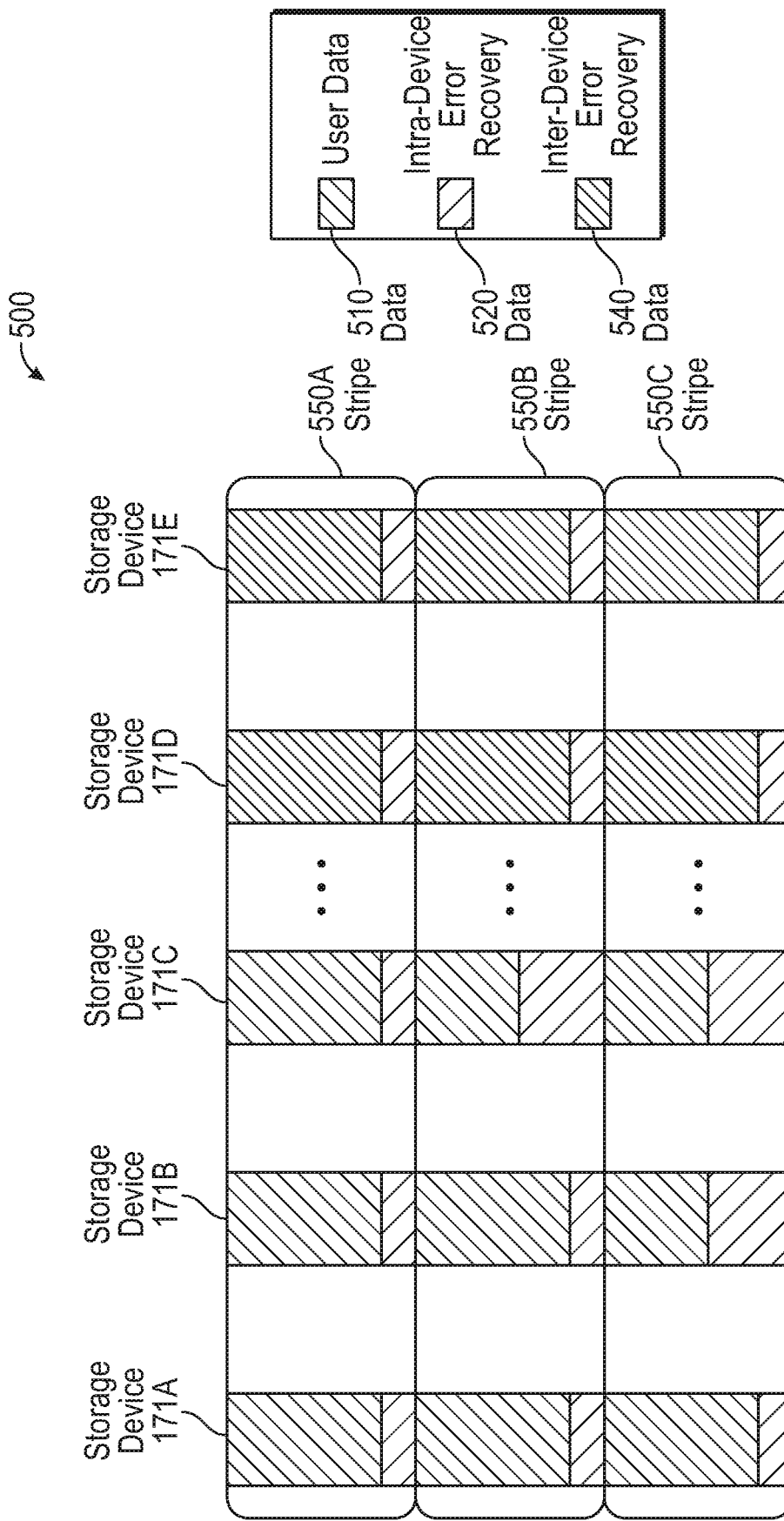
FIG. 5 illustrates an example system for RAID in a direct-mapped storage system, in accordance with some implementations.

FIG. 5 illustrates an example system 500 for RAID in a direct-mapped storage system, in accordance with some implementations. In one embodiment, an allocation unit within an SSD may include one or more direct-mapped erase blocks within a direct-mapped SSD. Referring to FIG. 5, the user data 510 may refer to both stored data to be modified and accessed by end-users and inter-device error-correction code (ECC) data. The inter-device ECC data may be parity information generated from one or more pages on other storage devices holding user data. For example, the inter-device ECC data may be parity information used in a RAID data layout architecture. The user data 510 may be stored within one or more pages included within one or more of the storage devices 171 a-171 k. In one embodiment, each of the storage devices 171 a-171 e is an SSD.

An erase block within an SSD may comprise several pages. As described earlier, in one embodiment, a page may include 4 KB of data storage space. An erase block may include 64 pages, or 256 KB. In other embodiments, an erase block may be 1 megabyte (MB), and include 256 pages, or 8 megabyte (MB) and include 2048 pages; or pages may be 8 KB or 16 KB with many variations in the size of erase blocks, generally based on the design of the Flash chips and how many bits are stored per Flash memory cell. An allocation unit size may be chosen in a manner to provide both sufficiently large sized units and a relatively low number of units to reduce overhead tracking of the allocation units. Allocation unit size may be determined based on erase block size and/or concerns about future garbage collection strategies. In one embodiment, one or more state tables may maintain a state of an allocation unit (allocated, free, erased, error), a wear level, and a count of a number of errors (correctable and/or uncorrectable) that have occurred within the allocation unit. In various embodiments, the size of an allocation unit may be selected to balance the number of allocation units available for a give device against the overhead of maintaining the allocation units. For example, in one embodiment the size of an allocation unit may be selected to be approximately ¹⁄₁₀₀th of one percent of the total storage capacity of an SSD. Other amounts of data storage space for pages, erase blocks and other unit arrangements are possible and contemplated.

Latent sector errors (LSEs) may occur when a given sector or other storage unit within a storage device is not validated and repaired for some extended period of time. A read or write operation may not be able to complete for the given sector. In addition, there may be an uncorrectable error-correction code (ECC) error. An LSE is an error that is undetected until the given sector is accessed. Therefore, any data previously stored in the given sector may be lost. A single LSE may lead to data loss when encountered during RAID reconstruction after a storage device failure. For an SSD, an increase in the probability of an occurrence of another LSE may result from at least one of the following statistics: device age, device size, access rates, storage compactness and the occurrence of previous correctable and uncorrectable errors, time since a page was written, and in some cases read or write activity to physically proximate areas of a Flash memory chip. To protect against LSEs and data loss within a given storage device, one of a multiple of intra-device redundancy schemes may be used within the given storage device.

An intra-device redundancy scheme utilizes ECC information, such as parity information, within the given storage device. This intra-device redundancy scheme and its ECC information corresponds to a given device and may be maintained within a given device, but is distinct from ECC that may be internally generated and maintained by the device itself. Generally speaking, the internally generated and maintained ECC of the device is invisible to the system within which the device is included. The intra-device ECC information included within the given storage device may be used to increase data storage reliability within the given storage device. This intra-device ECC information is in addition to other ECC information that may be included within another storage device such as parity information utilized in a RAID data layout architecture.

A highly effective intra-device redundancy scheme may sufficiently enhance a reliability of a given RAID data layout to cause a reduction in a number of devices used to hold parity information. For example, a double parity RAID layout may be replaced with a single parity RAID layout if there is additional intra-device redundancy to protect the data on each device. For a fixed degree of storage efficiency, increasing the redundancy in an intra-device redundancy scheme increases the reliability of the given storage device. However, increasing the redundancy in such a manner may also increase a penalty on the input/output (I/O) performance of the given storage device. One reason for this type of highly effective intra-device redundancy scheme may be to protect against double device failure with reduced concern for latent errors on the remaining devices. Latent errors may be scattered randomly, at low probability, and at high capacities, and may be undetected for some period of time. Device failures may be different and in some cases may be detected quickly, possibly resulting in the rebuilding of content that would have been stored on the failed devices. If two devices fail and the remaining devices some number of latent errors, some data may be unrecoverable. Advantageously, embodiments of the present disclosure aid in the recovery in such a case.

In one embodiment, an intra-device redundancy scheme divides a device into groups of locations for storage of user data. For example, a division may be a group of locations within a device that correspond to a stripe within a RAID layout as shown by stripes 550 a-550 c. User data or inter-device RAID redundancy information may be stored in one or more pages within each of the storage devices 171 a-171 e as shown by data 510. Within each storage device, intra-device error recovery data 520 may be stored in one or more pages. As used herein, the intra-device error recovery data 520 may be referred to as intra-device redundancy data 520. As is well known by those skilled in the art, the intra-device redundancy data 520 may be obtained by performing a function on chosen bits of information within the data 510. An XOR-based operation may be used to derive parity information to store in the intra-device redundancy data 520. Other examples of intra-device redundancy schemes include single parity check (SPC), maximum distance separable (MDS) erasure codes, interleaved parity check codes (IPC), hybrid SPC and MDS code (MDS+SPC), and column diagonal parity (CDP). The schemes vary in terms of delivered reliability and overhead depending on the manner the data 520 is computed. In addition to the above described redundancy information, the system may be configured to calculate a checksum value for a region on the device. For example, a checksum may be calculated when information is written to the device. This checksum is stored by the system. When the information is read back from the device, the system may calculate the checksum again and compare it to the value that was stored originally. If the two checksums differ, the information was not read properly, and the system may use other schemes to recover the data. Examples of checksum functions include cyclical redundancy check (CRC), MD5, and SHA-1.

As shown in stripes 550 *a*-250 *c*, the width, or number of pages, used to store the data 510 within a given stripe may be the same in each of the storage devices 171 *a*-171 *k*. However, as shown in stripes 550 *b*-250 *c*, the width, or number of pages, used to store the intra-device redundancy data 520 within a given stripe may not be the same in each of the storage devices 171 *a*-171 *e*. In one embodiment, changing characteristics or behaviors of a given storage device may determine, at least in part, the width used to store corresponding intra-device redundancy data 520.

Figure 6:
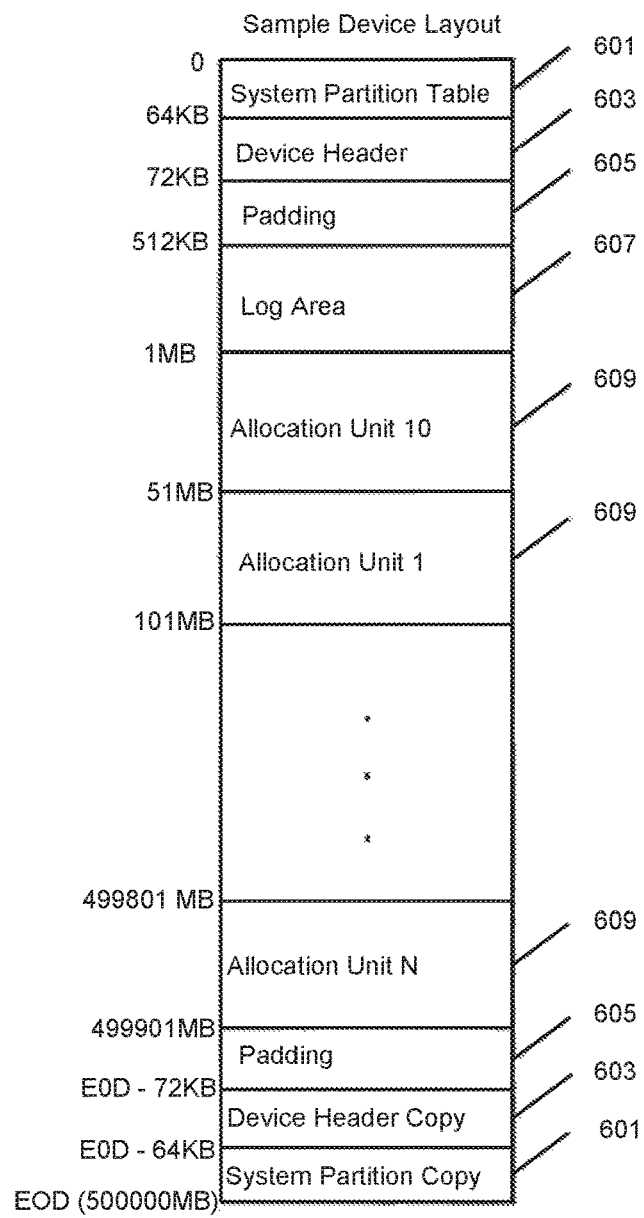
FIG. 6 illustrates an example storage device layout, in accordance with some implementations.

FIG. 6 illustrates an example storage device layout, in accordance with some implementations. In various embodiments, storage devices may be formatted with a partition table 601 at the beginning of the device, and a copy of the partition table at the end of the device. In another embodiment, a device header 603 may be stored in the first and last blocks. For example, in a flash based storage device, a device header may be stored in the first and last erase blocks. As previously discussed, an erase block is a flash construct that is typically in the range of 256 KB-1 MB. Additional unused space in the first erase block may be reserved (padding 605). Diagnostic information 607 may be storaged in various erase blocks on the storage device. The rest of the erase blocks in between are divided into Allocation Units (AUs) 609 of a multiple erase blocks. The AU size may be chosen so there are a reasonable number of AUs per device for good allocation granularity. Any number of AUs is possible. In one embodiment, there may be something in the range of millions of AUs on a device to permit allocation in large enough units to avoid overhead, but not too many units for easy tracking. Tracking of the state of an AU (allocated/free/erased/bad) may be maintained an AU State Table. The wear level of an AU may be maintained in a Wear Level Table, and a count of errors may be maintained in an AU Error Table. In various embodiments, the physical layer allocates space in segments which include one segment shard in each device across a set of devices (which could be on different nodes).

Figure 7:
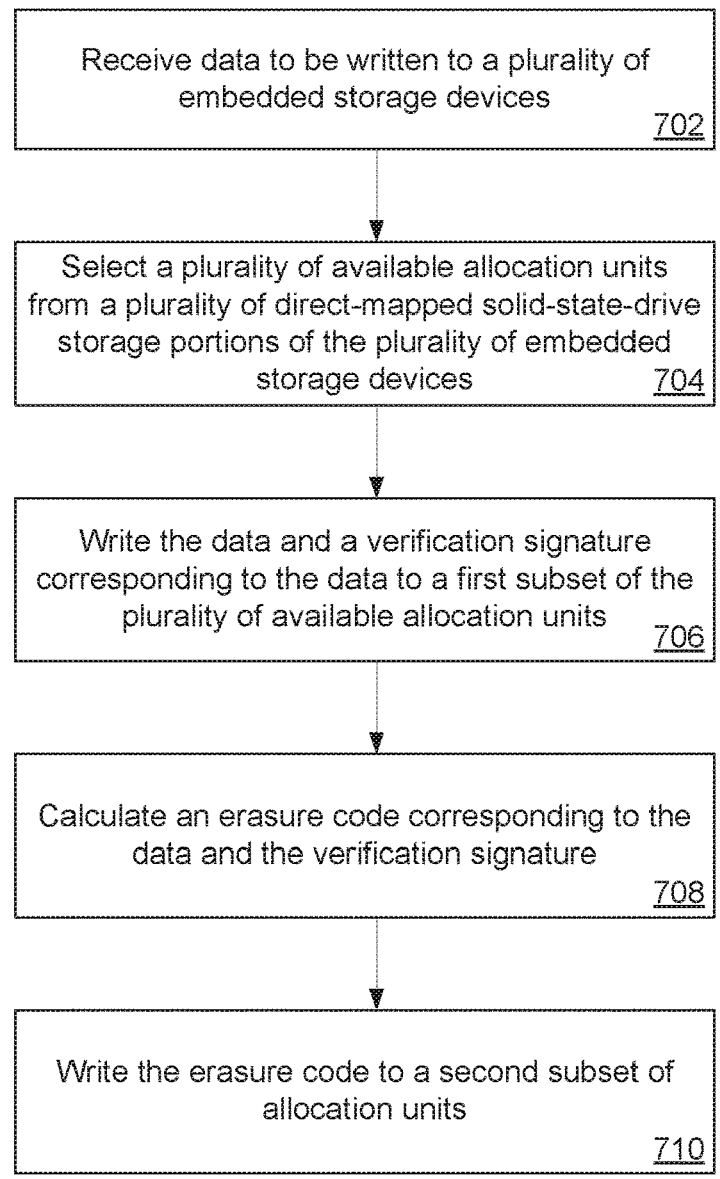
FIG. 7 illustrates a flow diagram for RAID in a direct-mapped storage system, in accordance with some implementations.

FIG. 7 illustrates a flow diagram for RAID in a direct-mapped storage system, in accordance with some implementations. The method 700 may be performed by processing logic that comprises hardware (e.g., circuitry, dedicated logic, programmable logic, microcode, etc.), software (e.g., instructions run on a processing device to perform hardware simulation), or a combination thereof.

Referring to FIG. 7, at block 702, processing logic receives data to be written to a plurality of embedded storage devices. The data may be written to a number of allocation units spread out across the embedded storage devices. Processing logic, at block 704, selecting a plurality of available allocation units from a plurality of direct-mapped solid-state-drive storage portions of the plurality of embedded storage devices, respectively. At block 706, processing logic may write the data and a verification signature (e.g., a hash, a checksum, etc.) corresponding to the data to a first subset of the plurality of available allocation units. In one embodiment, processing logic calculates a verification signature corresponding to each allocation unit in the first subset of available allocation units. In one embodiment, verification signatures may be used to verify the integrity of the data to which they correspond. At block 708, processing logic may calculate an erasure code corresponding to the data and the verification signature, and at block 710, processing logic may write the erasure code to a second subset of allocation units. In one embodiment, processing logic may calculate a plurality of additional erasure codes corresponding to the data contained in the allocation units (e.g., 'P' and a 'Q' erasure codes in a RAID system). An erasure code may be referred to herein as having multiple portions. In such a case, each portion may be understood as an individual erasure code. In one embodiment, an erasure code may correspond to a separate one of the plurality of available allocation units. Processing logic may further write the plurality of additional erasure codes to the allocation units (e.g., each additional erasure code to a corresponding allocation unit). In another embodiment, processing logic may write the plurality of erasure codes to allocation units that do not correspond to the erasure code (e.g., to a separate allocation unit on the same drive as the allocation unit to which the erasure code corresponds).

In one embodiment, processing logic may detect that an allocation unit of the first subset of the available allocation units has failed or has been corrupted by comparing the data to the verification signature and, in response to the detecting, recovering a portion of the data from the allocation unit based on the data written to the first subset of the available allocation units and the erasure code. In another embodiment, processing logic may determining that a device controller of an embedded storage device corresponding to the allocation unit did not correct a failure or corruption of the allocation unit and, after determining that the device controller did not correct the failure or corruption, recover that portion of the data.

In one embodiment, the erasure code includes a first portion and a second portion. To write the erasure code, processing logic may write the first portion to a first allocation unit of the subset of the plurality of available allocation units and write the second portion to a second allocation unit of the subset of the plurality of available allocation units in parallel with the first portion.

Processing logic may journal the data in a non-volatile random-access memory (NVRAM) portion. In one embodiment, the direct-mapped SSD portion and the NVRAM portion are separately addressable. In another embodiment, the NVRAM portion is smaller than the direct-mapped SSD portion. As described above, the NVRAM portion may include a random access memory (RAM) device, an energy storing device (e.g., a battery, capacitor, etc.), and a processing device.

What is claimed is:

1. A method comprising:
   storing verification data associated with data to be written and erasure codes associated with the data to be written and the verification data separately in a plurality of storage devices; and
   determining, by a processing device, whether the data to be written to the plurality of storage devices is corrupted using the verification data and the erasure codes.

2. The method of claim 1, wherein the verification data comprises a verification signature corresponding to the data.

3. The method of claim 1, wherein the plurality of storage devices include direct mapped solid state drives.

4. The method of claim 1, wherein the erasure code comprises a first portion and a second portion, the method further comprising:
   writing the first portion to a first storage device of the plurality of storage devices and the second portion to a second storage device of the plurality of storage devices.

5. The method of claim 1, further comprising, in response to determining that the data is corrupted, recovering a portion of the data based on the erasure code.

6. The method of claim 5, further comprising:
   responsive to determining that a device controller of a storage device of the plurality of storage devices corresponding to the data did not correct corruption of the data,
   recovering a portion of the data.

7. The method of claim 1, wherein the each of the plurality of storage drives comprises a direct-mapped solid-state-drive (SSD) portion and a non-volatile random-access memory (NVRAM) portion, the method further comprising journaling the data in the NVRAM portion, wherein the direct-mapped SSD portion and the NVRAM portion are separately addressable, and wherein the NVRAM portion is smaller than the direct-mapped SSD portion.

8. The method of claim 7, wherein the NVRAM portion comprises:
   a random access memory (RAM) device, an energy storing device, and a processing device.

9. A storage system comprising:
   a plurality of embedded storage devices, wherein each embedded storage device of the plurality of embedded storage devices comprises a direct-mapped solid state drive (SSD) storage portion; and
   a plurality of storage system controllers, operatively coupled to the plurality of embedded storage devices, the plurality of storage system controllers to:
      store verification data associated with data to be written and erasure codes associated with the data to be written and the verification data separately in a plurality of storage devices; and
      determine whether the data to be written to the plurality of storage devices is lost or corrupted using the verification data and the erasure codes.

10. The storage system of claim 9, wherein the verification data comprises a verification signature corresponding to the data.

11. The storage system of claim 9, wherein the direct mapped solid state drives enable addresses data blocks within the solid state drives without an address translation performed by storage system controllers of the solid state drives.

12. The storage system of claim 9, wherein the erasure code comprises a first portion and a second portion, the plurality of storage system controllers further to:
   write the first portion to a first storage device of the plurality of embedded storage devices and
   write the second portion to a second storage device of the plurality of embedded storage devices.

13. The storage system of claim 9, the plurality of storage system controllers further to, in response to determining that the data is corrupted, recover a portion of the data based on the erasure code.

14. The storage system of claim 13, the plurality of storage system controllers further to:
   responsive to determining that a storage system controller of the plurality of storage system controllers corresponding to the data did not correct corruption of the data,
   recover the portion of the data.

15. The storage system of claim 9, wherein the each of the plurality of embedded storage drives comprises a direct-mapped solid-state-drive (SSD) portion and a non-volatile random-access memory (NVRAM) portion, the plurality of storage system controllers further to journal the data in the NVRAM portion, wherein the direct-mapped SSD portion and the NVRAM portion are separately addressable, and wherein the NVRAM portion is smaller than the direct-mapped SSD portion.

16. The storage system of claim 15, wherein the NVRAM portion comprises:
   a random access memory (RAM) device, an energy storing device, and a processing device.

17. A non-transitory computer-readable medium having instructions encoded thereon which, when executed by a processing device, cause the processing device to:
   store verification data associated with data to be written and erasure codes associated with the data to be written and the verification data separately in a plurality of storage devices; and
   determine, by the processing device, whether the data to be written to the plurality of storage devices is lost or corrupted using the verification data and the erasure codes.

18. The non-transitory computer-readable medium of claim 17, wherein the verification data comprises a verification signature corresponding to the data.

19. The non-transitory computer-readable medium of claim 17, wherein the erasure code comprises a first portion and a second portion, the processing device further to:
   write the first portion to a first storage device of the plurality of storage devices and the second portion to a second storage device of the plurality of storage devices.

20. The non-transitory computer-readable medium of claim 17, the processing device further to, in response to determining that the data is corrupted, recover a portion of the data based on the erasure code.

* * * * *